US011563414B2

(12) United States Patent
Choi et al.

(10) Patent No.: US 11,563,414 B2
(45) Date of Patent: Jan. 24, 2023

(54) MULTILAYER ELECTRONIC DEVICE INCLUDING A CAPACITOR HAVING A PRECISELY CONTROLLED CAPACITIVE AREA

(71) Applicant: AVX Corporation, Fountain Inn, SC (US)

(72) Inventors: Kwang Choi, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 299 days.

(21) Appl. No.: 16/720,042

(22) Filed: Dec. 19, 2019

(65) Prior Publication Data
US 2020/0203075 A1   Jun. 25, 2020

Related U.S. Application Data

(60) Provisional application No. 62/782,496, filed on Dec. 20, 2018.

(51) Int. Cl.
*H03H 7/01* (2006.01)
*H01G 4/30* (2006.01)
(Continued)

(52) U.S. Cl.
CPC ........... *H03H 7/0115* (2013.01); *H01G 2/065* (2013.01); *H01G 4/005* (2013.01); *H01G 4/12* (2013.01);
(Continued)

(58) Field of Classification Search
CPC ................... H03H 2001/0085; H03H 7/0115
(Continued)

(56) References Cited

U.S. PATENT DOCUMENTS 5,357,227 A   10/1994   Tonegawa et al.
6,529,101 B2   3/2003   Tojyo et al.
(Continued)

FOREIGN PATENT DOCUMENTS

CN      1855613 A    11/2006
CN    102354777 A     2/2012
(Continued)

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.
(Continued)

*Primary Examiner* — Rakesh B Patel
(74) *Attorney, Agent, or Firm* — Dority & Manning, P.A.

(57) ABSTRACT

A multilayer electronic device may include a plurality of dielectric layers stacked in a Z-direction that is perpendicular to an X-Y plane. The device may include a first conductive layer overlying one of the plurality of dielectric layers. The multilayer electronic device may include a second conductive layer overlying another of the plurality of dielectric layers and spaced apart from the first conductive layer in the Z-direction. The second conductive layer may overlap the first conductive layer in the X-Y plane at an overlapping area to form a capacitor. The first conductive layer may have a pair of parallel edges at a boundary of the overlapping area and an offset edge within the overlapping area that is parallel with the pair of parallel edges. An offset distance between the offset edge and at least one of the pair of parallel edges may be less than about 500 microns.

31 Claims, 31 Drawing Sheets

(51) Int. Cl.
*H01G 4/005* (2006.01)
*H01G 4/12* (2006.01)
*H01L 49/02* (2006.01)
*H01G 2/06* (2006.01)
*H05K 3/46* (2006.01)
*H05K 1/11* (2006.01)
*H03H 1/00* (2006.01)

(52) U.S. Cl.
CPC ............... *H01G 4/30* (2013.01); *H01L 28/60* (2013.01); *H03H 7/01* (2013.01); *H05K 1/11* (2013.01); *H05K 3/4697* (2013.01); *H03H 2001/0085* (2013.01); *H05K 2201/10015* (2013.01); *H05K 2201/10515* (2013.01)

(58) Field of Classification Search
USPC .................................................. 333/175, 185
See application file for complete search history.

(56) References Cited

U.S. PATENT DOCUMENTS

| | | |
|---|---|---|
| 6,556,416 B2 | 4/2003 | Kunihiro |
| 6,720,848 B2 | 4/2004 | Okamura et al. |
| 6,734,755 B2 | 5/2004 | Cites et al. |
| 6,771,148 B2 | 8/2004 | Okamura et al. |
| 6,791,435 B2 | 9/2004 | Shingaki et al. |
| 6,900,708 B2 | 5/2005 | White et al. |
| 6,958,667 B2 | 10/2005 | Mizoguchi et al. |
| 6,970,057 B2 | 11/2005 | Lin et al. |
| 7,068,124 B2 | 6/2006 | White et al. |
| 7,098,760 B2 | 8/2006 | Okamura et al. |
| 7,119,639 B2 | 10/2006 | Okamura et al. |
| 7,126,444 B2 | 10/2006 | Fukinaga et al. |
| 7,187,109 B2 | 3/2007 | Tikka et al. |
| 7,239,219 B2 | 7/2007 | Brown et al. |
| 7,239,221 B2 | 7/2007 | Okamura et al. |
| 7,245,194 B2 | 7/2007 | Muto |
| 7,268,648 B2 | 9/2007 | Okamura et al. |
| 7,312,676 B2 | 12/2007 | Kundu |
| 7,592,885 B2 | 9/2009 | Sekine et al. |
| 7,612,634 B2 | 11/2009 | Iwata |
| 7,652,554 B2 | 1/2010 | Moriai et al. |
| 7,907,034 B2 | 3/2011 | Taniguchi |
| 8,013,688 B2 | 9/2011 | White et al. |
| 8,067,723 B2 | 11/2011 | Yamada et al. |
| 8,106,722 B2 | 1/2012 | Shimamura et al. |
| 8,159,313 B2 | 4/2012 | Uchaykin |
| 8,179,210 B2 | 5/2012 | Feichtinger |
| 8,384,013 B2 | 2/2013 | Yamada et al. |
| 8,390,984 B2 | 3/2013 | Liu et al. |
| 8,405,468 B2 | 3/2013 | Uchaykin |
| 8,446,705 B2 | 5/2013 | Ritter et al. |
| 8,451,037 B2 | 5/2013 | Hoeft et al. |
| 8,659,871 B2 | 2/2014 | Togashi et al. |
| 8,754,726 B2 | 6/2014 | Sasaki et al. |
| 9,142,342 B2 | 9/2015 | Haner |
| 9,218,910 B2 | 12/2015 | Kim |
| 9,240,392 B2 | 1/2016 | Hurwitz et al. |
| 9,287,845 B2 | 3/2016 | Fukamachi et al. |
| 9,349,788 B2 | 5/2016 | Hurwitz et al. |
| 9,647,313 B2 | 5/2017 | Marconia et al. |
| 9,698,747 B2 | 7/2017 | Ishizuka |
| 9,935,603 B2 | 4/2018 | Imamura |
| 9,949,373 B2 | 4/2018 | Hurwitz et al. |
| 10,014,843 B2 | 7/2018 | Hurwitz et al. |
| 10,063,211 B2 | 8/2018 | Yehezkely et al. |
| 10,110,196 B2 | 10/2018 | Mukai |
| 10,218,330 B2 | 2/2019 | Park et al. |
| 10,236,854 B2 | 3/2019 | Hurwitz et al. |
| 10,277,190 B2 | 4/2019 | Masuda et al. |
| 10,283,566 B2 | 5/2019 | Sel et al. |
| 10,389,329 B2 | 8/2019 | Shiokawa |
| 10,466,335 B2 | 10/2019 | Hurwitz et al. |
| 10,763,214 B2 | 9/2020 | Kariyazaki et al. |
| 10,944,375 B2 | 3/2021 | Imamura |
| 11,114,993 B2 | 11/2021 | Choi et al. |
| 2006/0055489 A1 | 3/2006 | Okamura et al. |
| 2007/0085108 A1 | 4/2007 | White et al. |
| 2008/0047743 A1 | 2/2008 | Komatsu et al. |
| 2009/0027141 A1* | 1/2009 | Oshima ................ H03H 7/1758 333/204 |
| 2009/0033439 A1 | 2/2009 | Igarashi |
| 2011/0096463 A1* | 4/2011 | Togashi ................ H01G 4/228 361/306.3 |
| 2014/0153154 A1 | 6/2014 | Choi et al. |
| 2015/0188511 A1* | 7/2015 | Ishizuka ................. H03H 7/38 333/32 |
| 2015/0296617 A1 | 10/2015 | Hurwitz et al. |
| 2016/0307702 A1 | 10/2016 | Tanaka et al. |
| 2017/0133997 A1 | 5/2017 | Imamura |
| 2020/0204137 A1 | 6/2020 | Choi et al. |
| 2020/0204138 A1 | 6/2020 | Choi et al. |
| 2020/0204142 A1 | 6/2020 | Choi et al. |
| 2020/0205285 A1 | 6/2020 | Choi et al. |

FOREIGN PATENT DOCUMENTS

| | | |
|---|---|---|
| EP | 2 068 393 A1 | 6/2009 |
| JP | S 55-169843 | 12/1980 |
| JP | S 58-028821 | 2/1983 |
| JP | 2008004768 A | 1/2008 |
| JP | 2008017243 A | 1/2008 |
| JP | 4539422 B2 | 9/2010 |
| JP | 5152192 B2 | 2/2013 |
| JP | 2018067612 A | 4/2018 |
| KR | 20170004238 A | 1/2017 |
| TW | 548669 B | 8/2003 |
| WO | WO 2004/004061 | 1/2004 |

OTHER PUBLICATIONS

International Search Report and Written Opinion for PCT/US2019/067372 dated Apr. 23, 2020, 11 pages.
Yong Zeng, "Research on LTCC Microwave Module Integration Technology," *Wanfang Academic Database*, Oct. 8, 2007, pp. 13-63.
CN Search Report for CN 201980084715.0 dated Oct. 8, 2021, 2 pages.

* cited by examiner

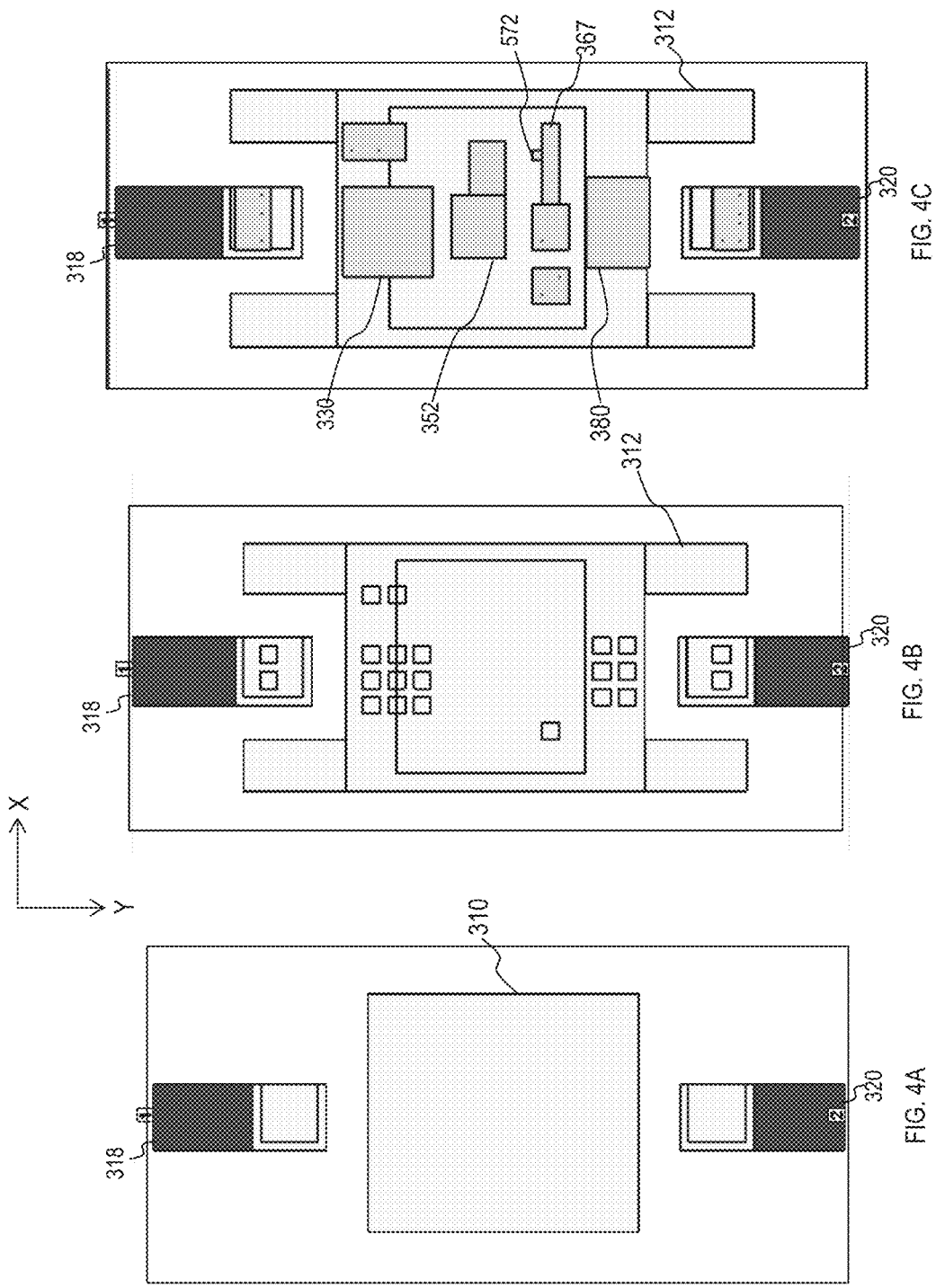

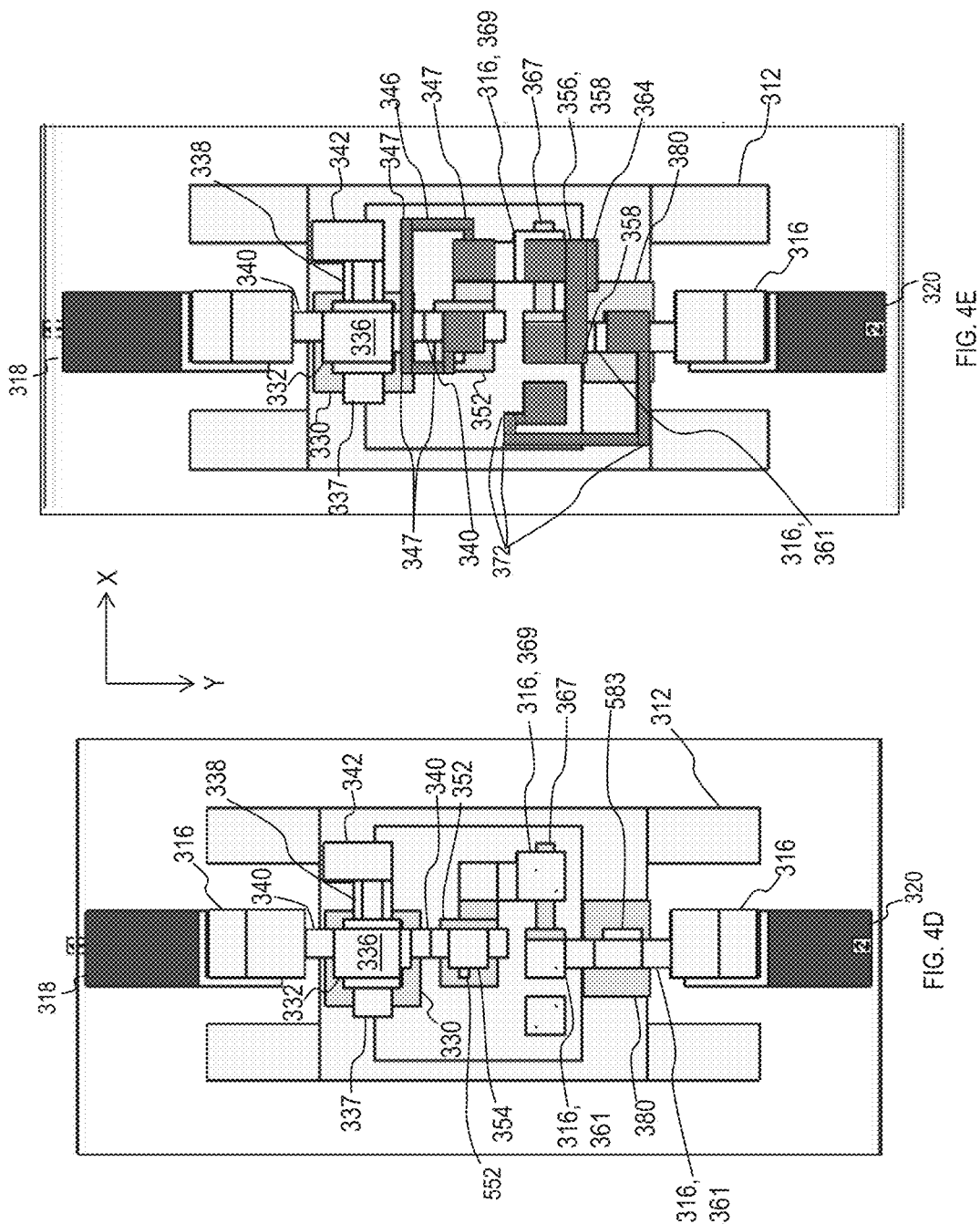

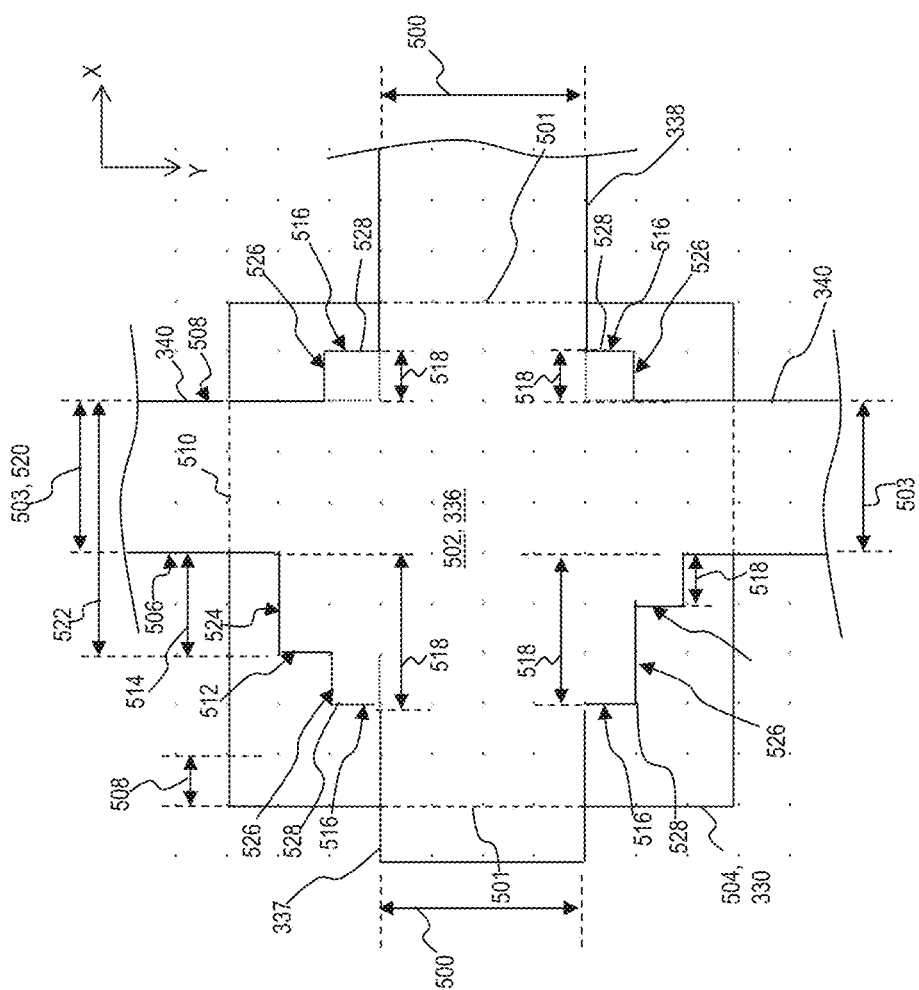

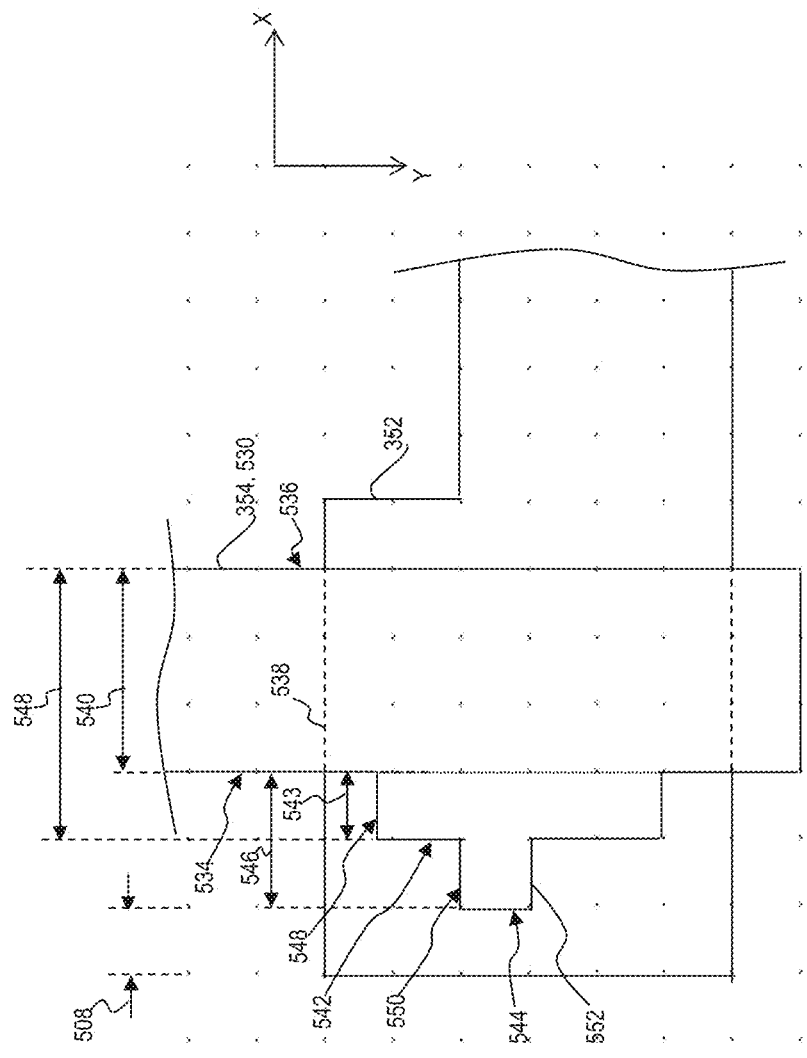

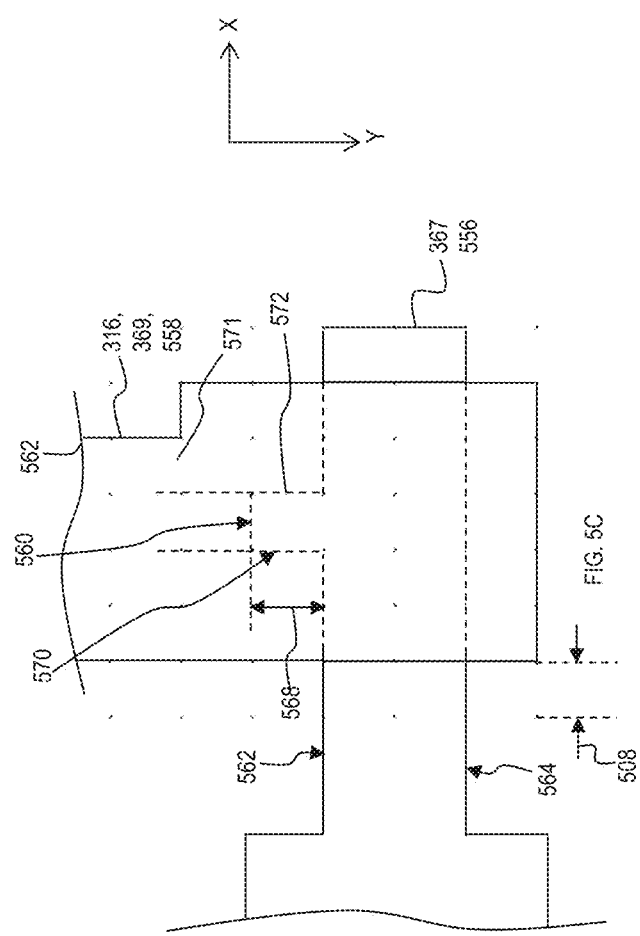

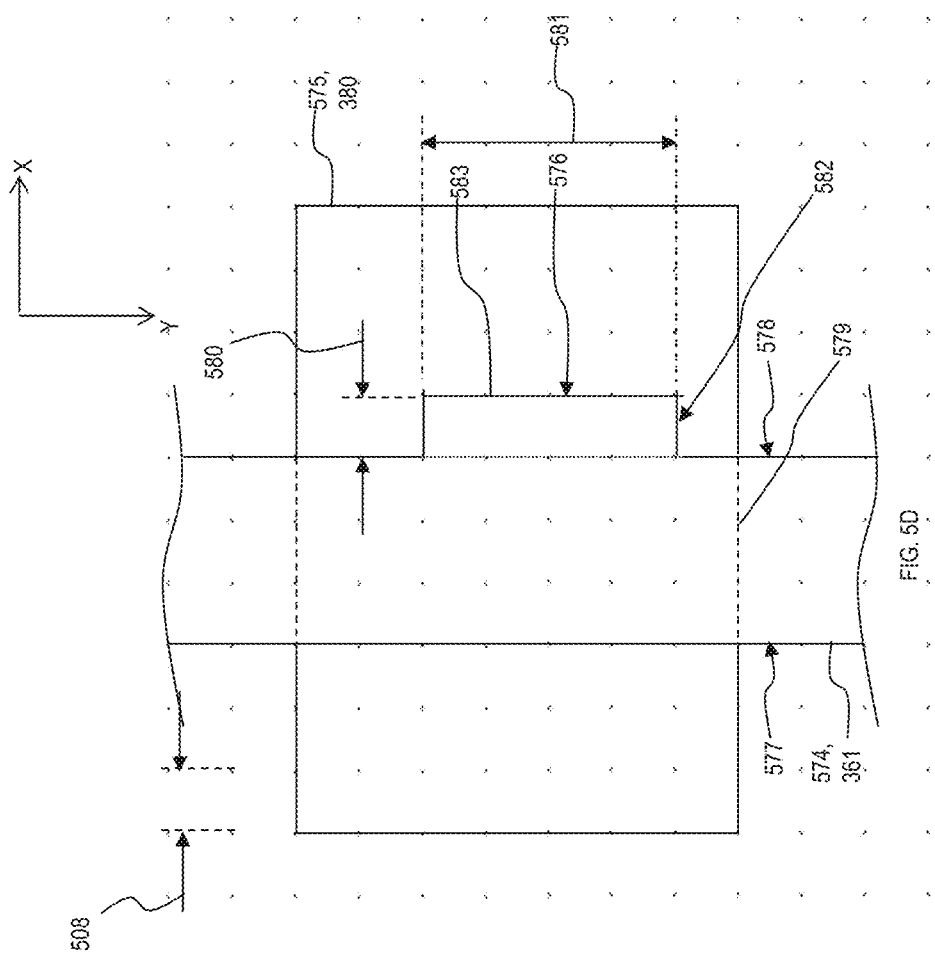

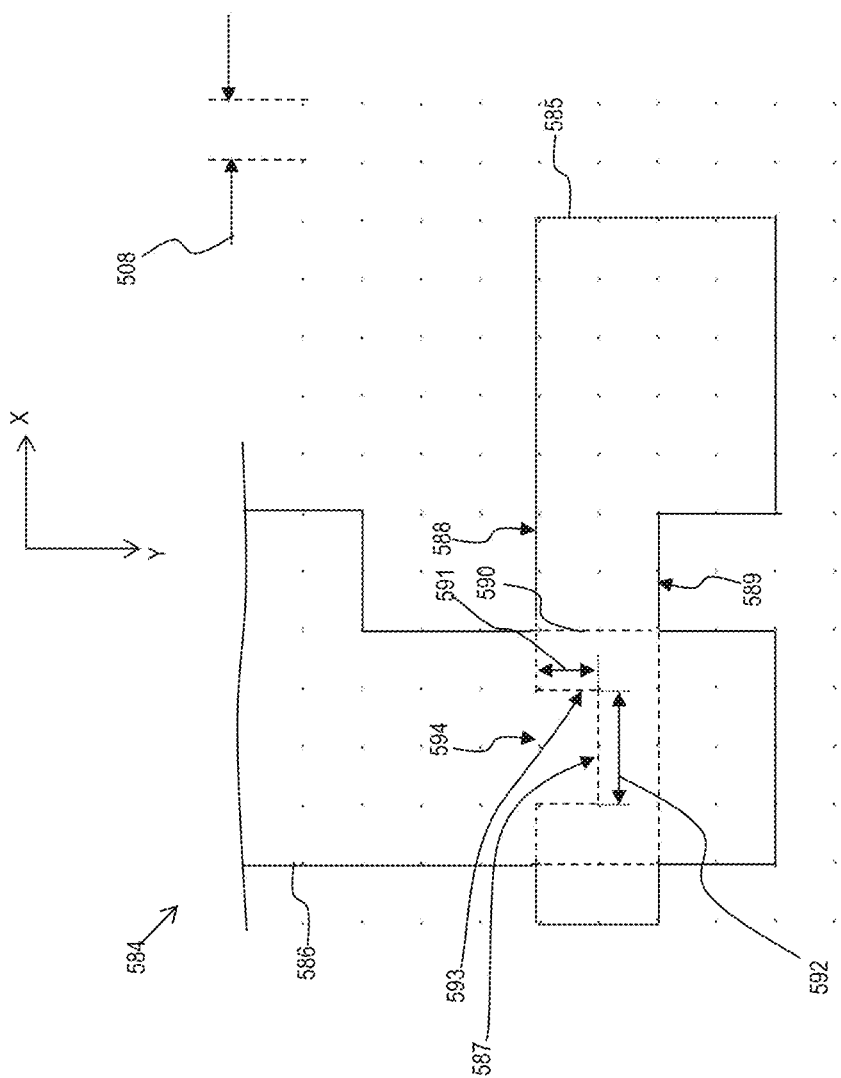

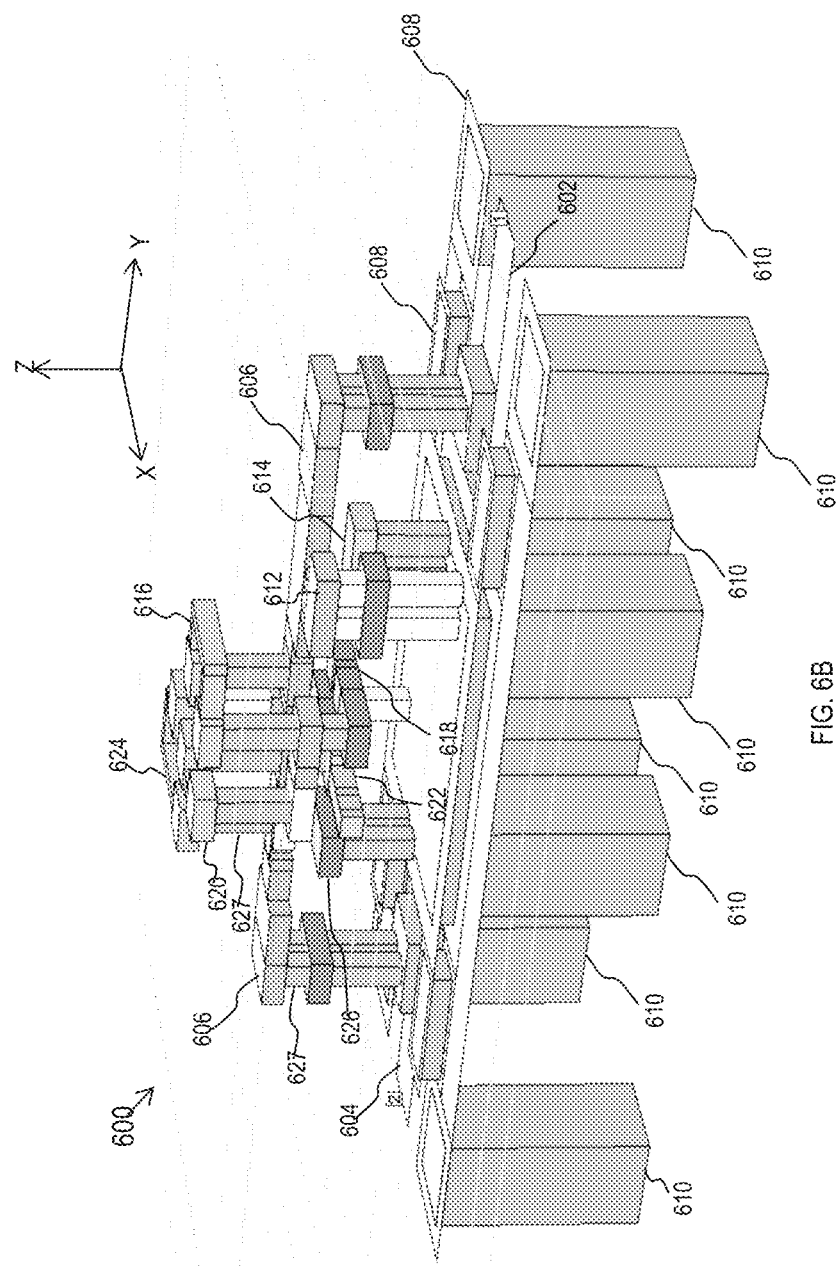

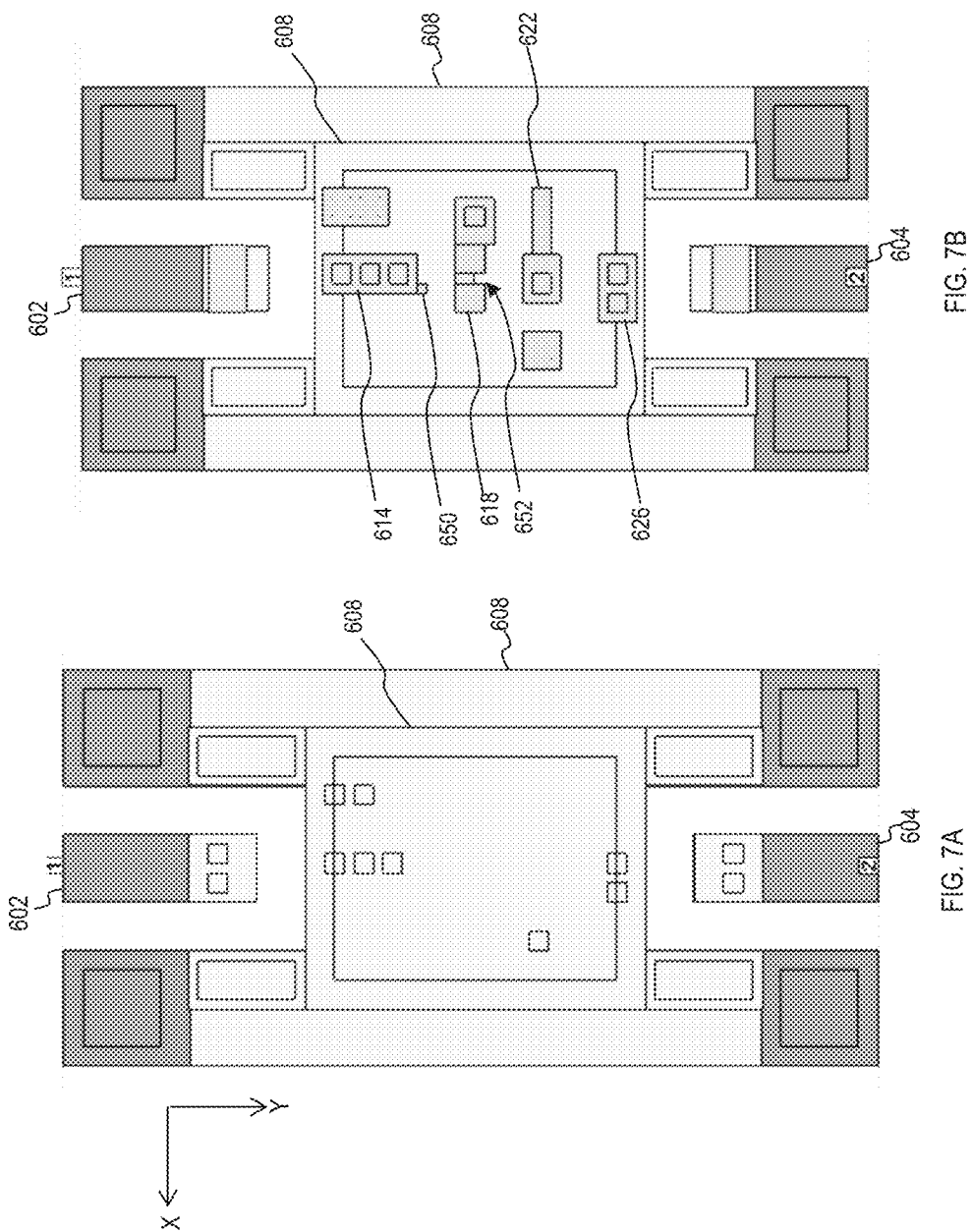

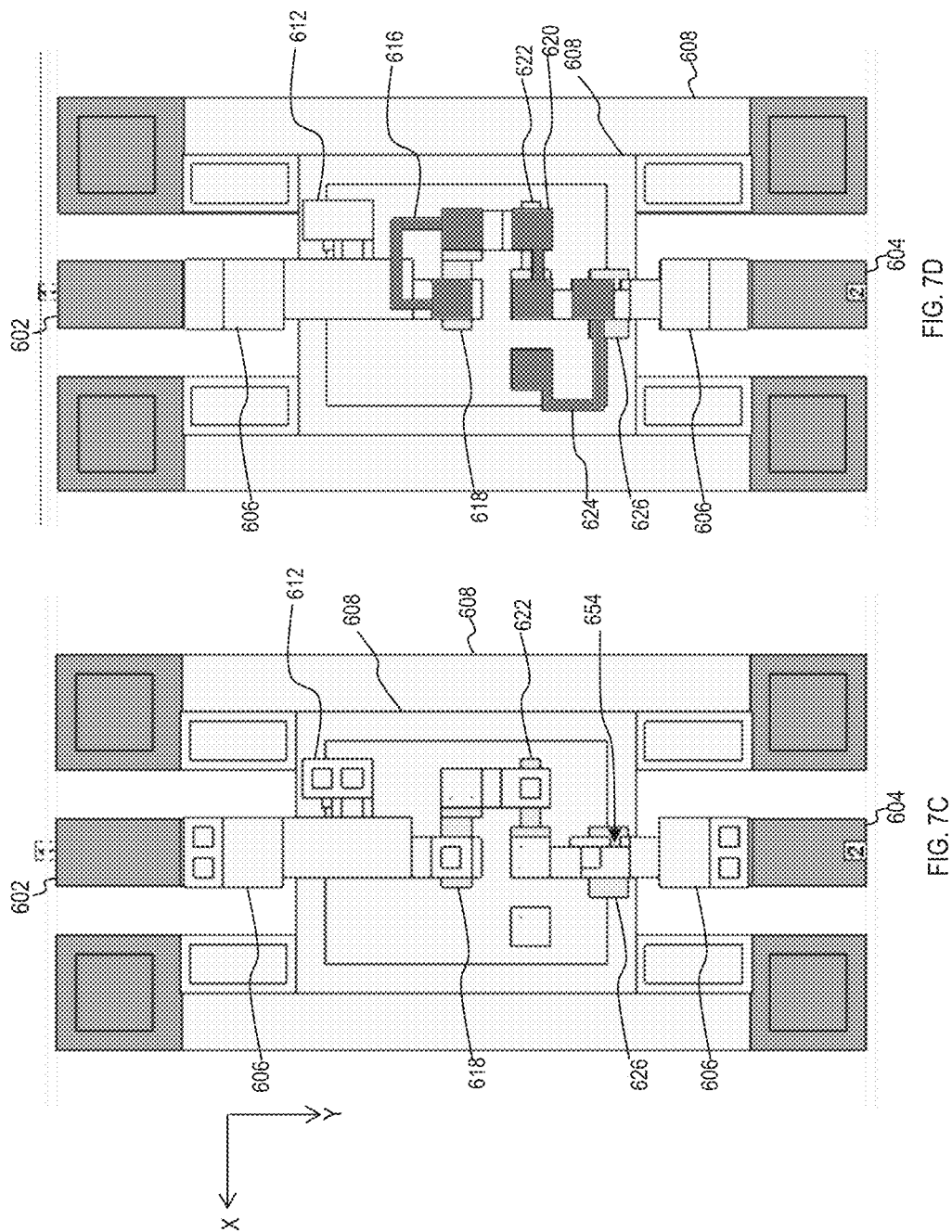

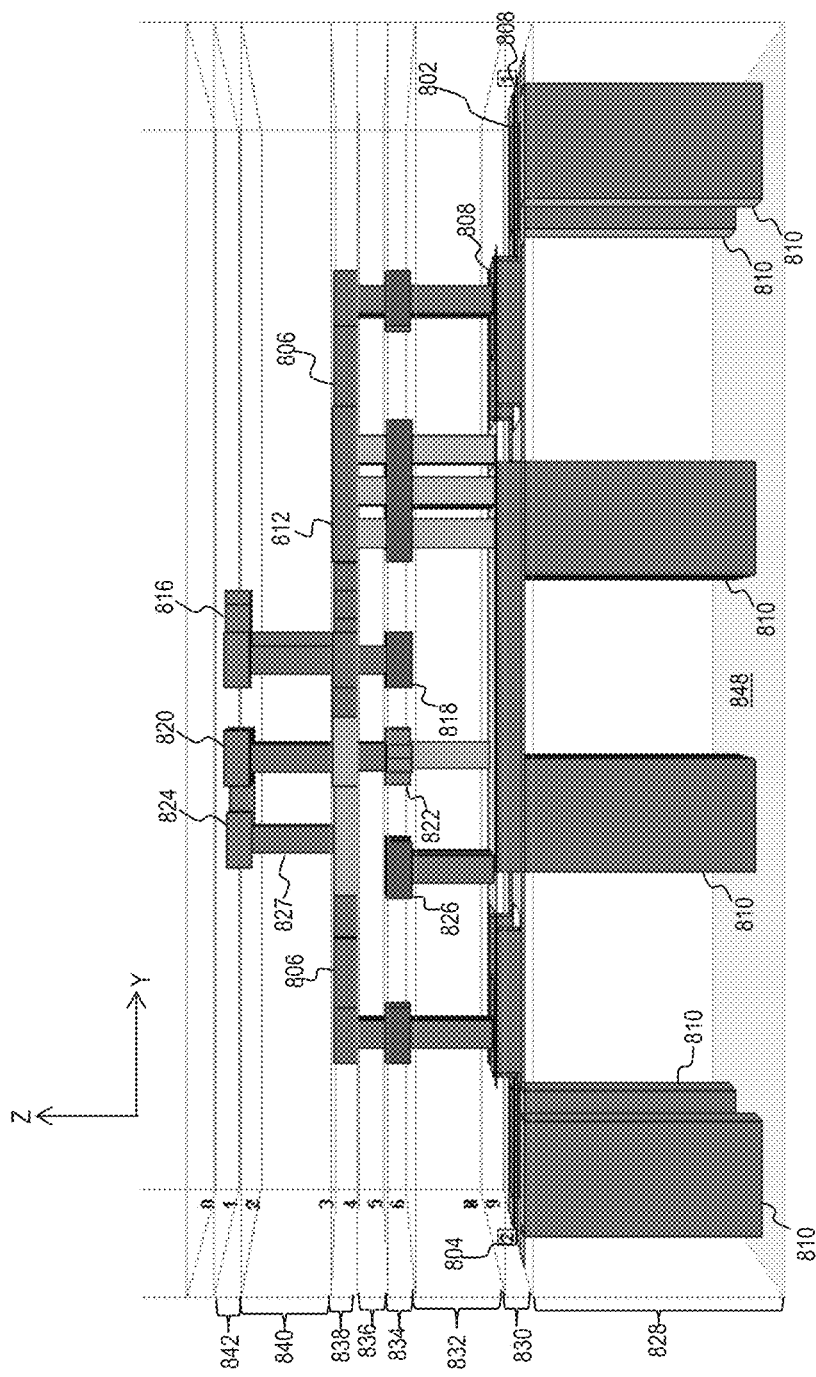

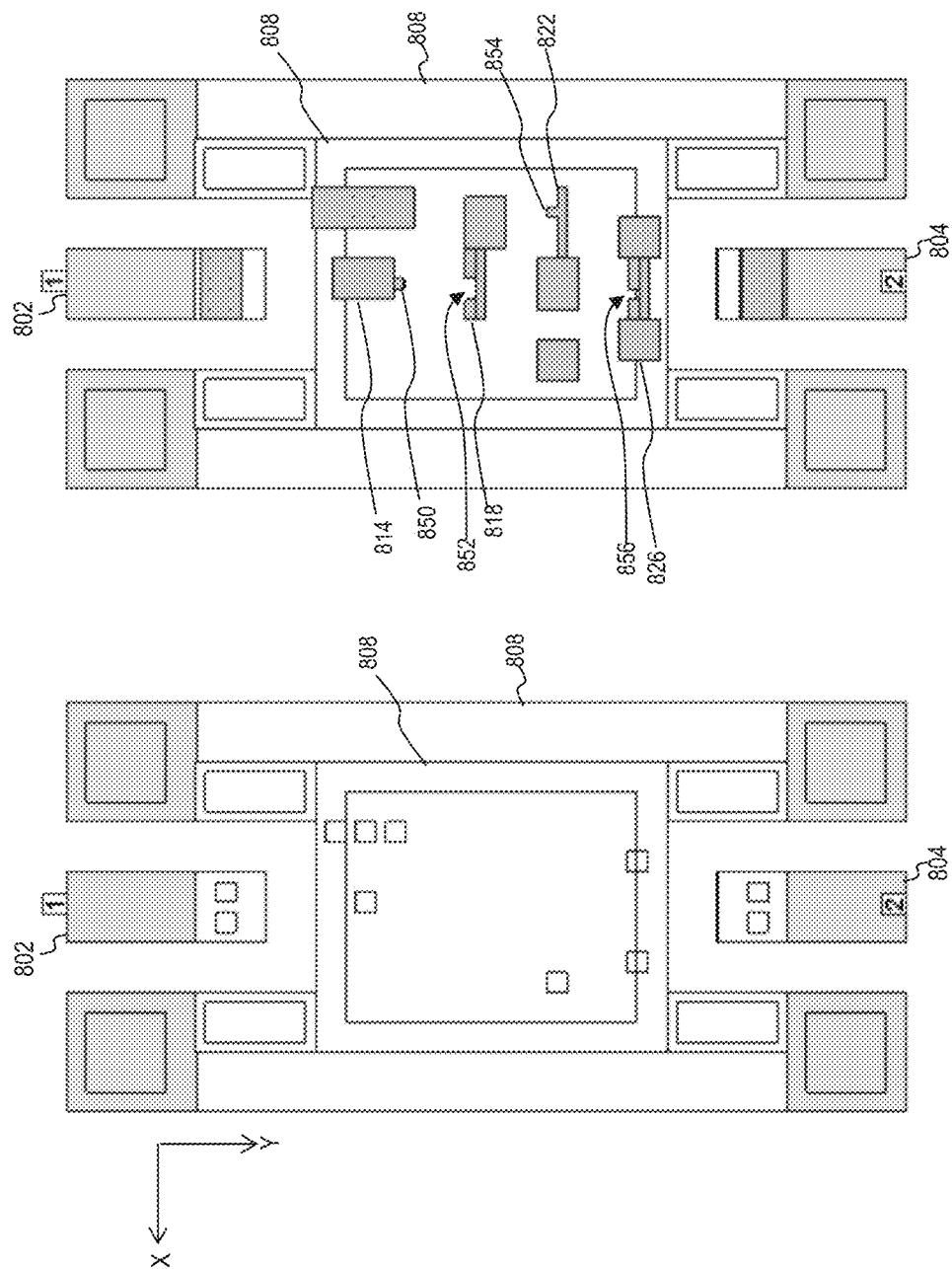

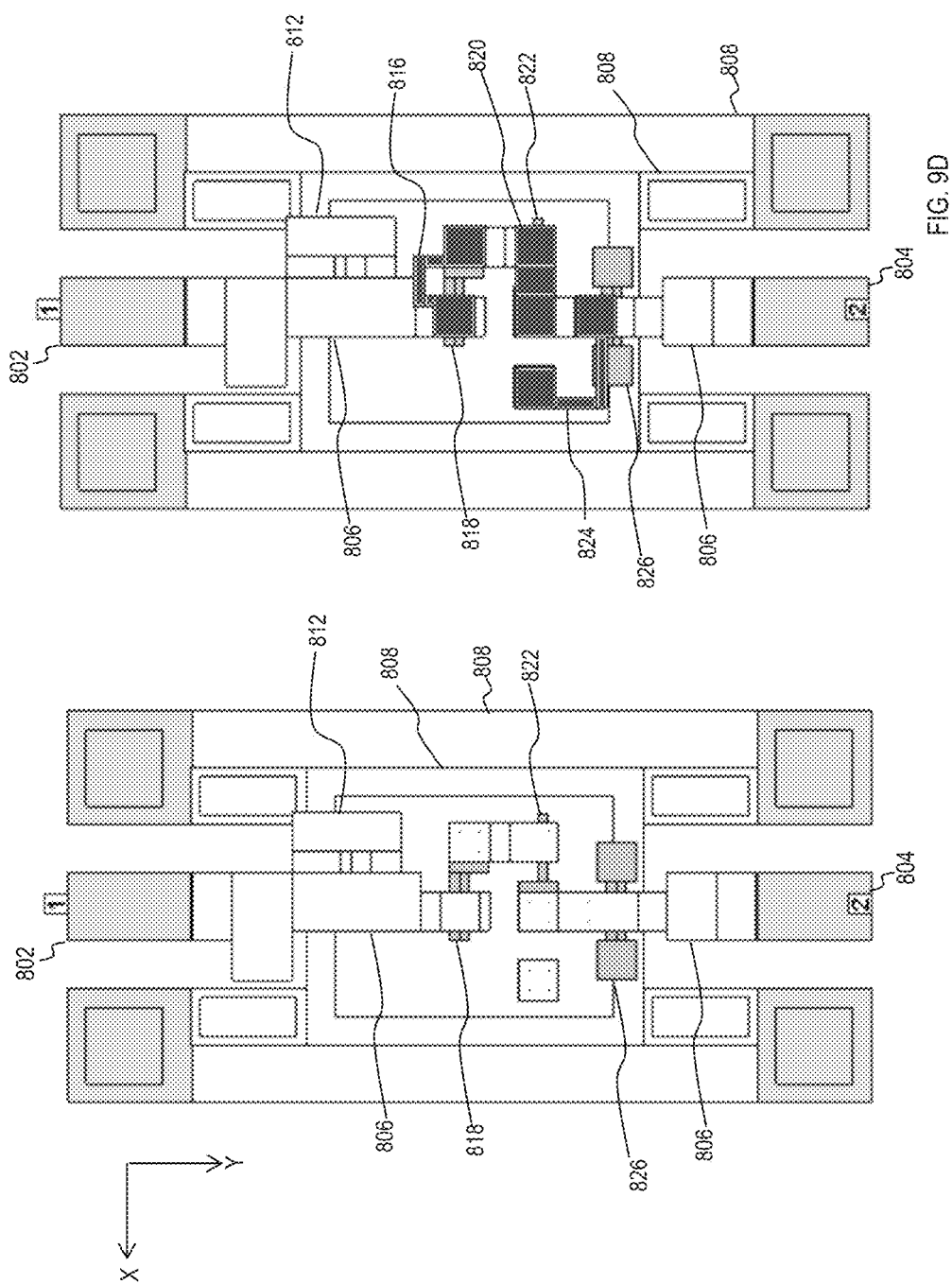

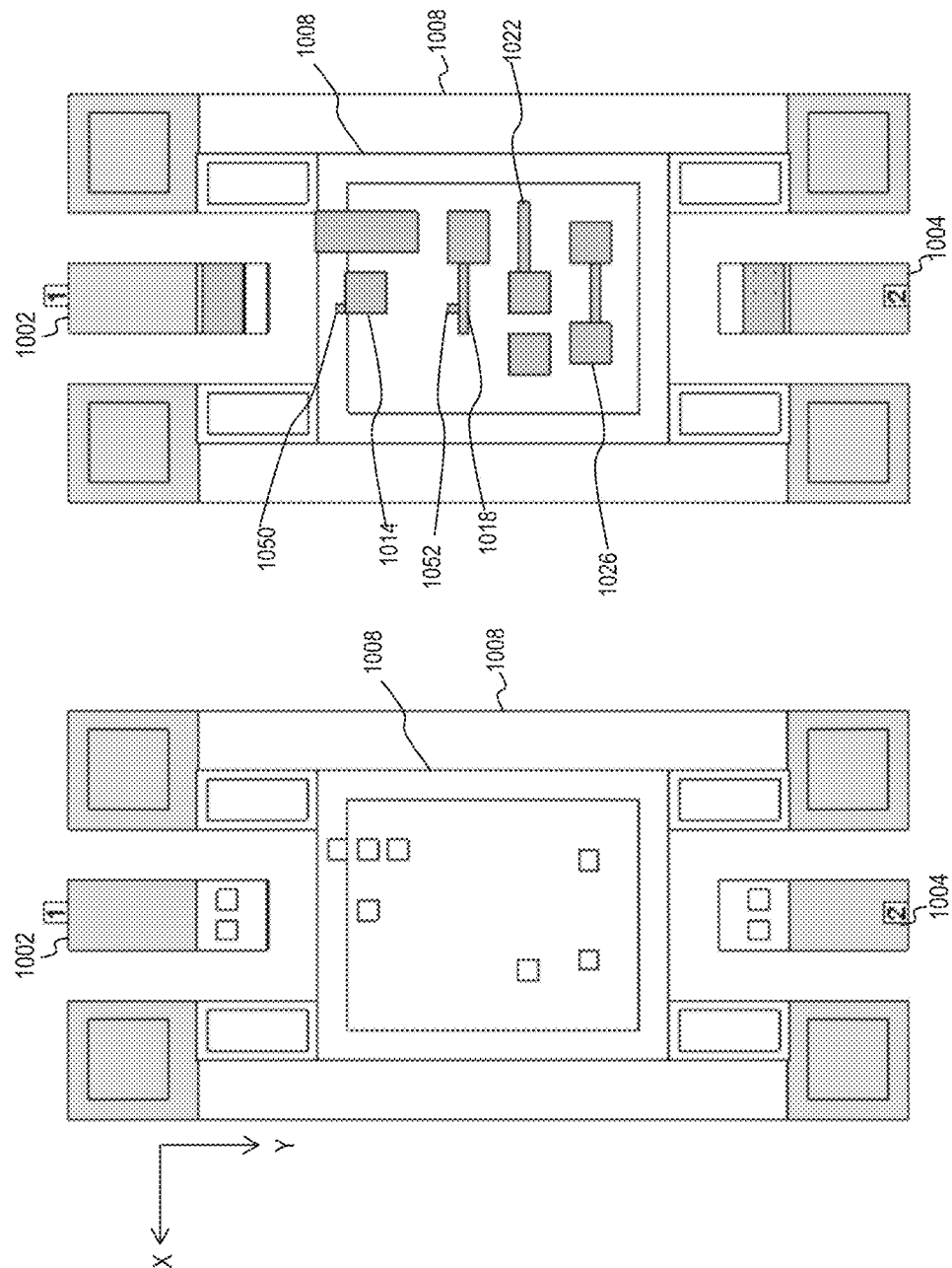

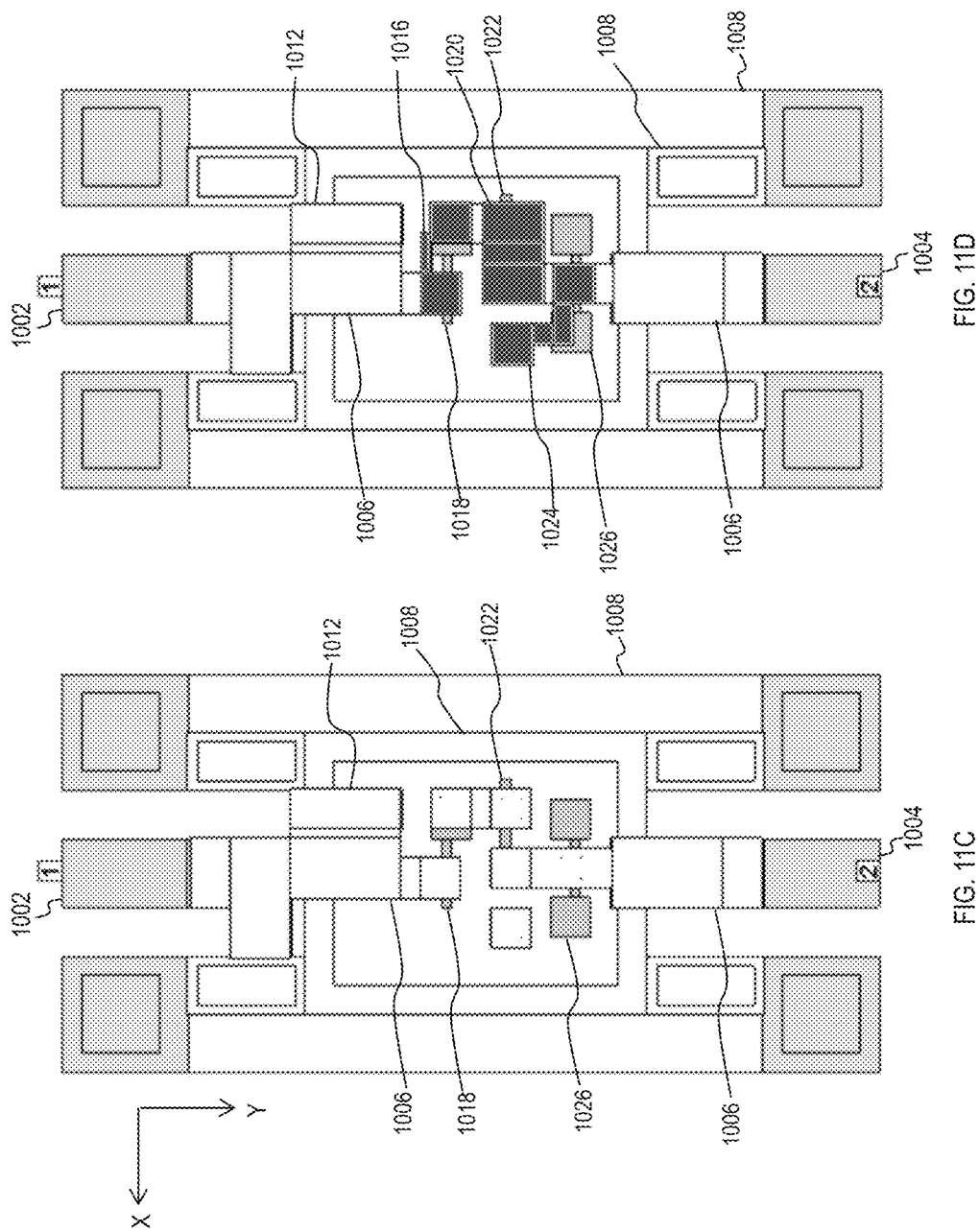

MULTILAYER ELECTRONIC DEVICE INCLUDING A CAPACITOR HAVING A PRECISELY CONTROLLED CAPACITIVE AREA

CROSS REFERENCE TO RELATED APPLICATION

The present application claims filing benefit of U.S. Provisional Patent Application Ser. No. 62/782,496 having a filing date of Dec. 20, 2018, which is incorporated herein by reference in its entirety.

BACKGROUND OF THE DISCLOSURE

Multilayer electronic devices often include capacitors. For example, multilayer filters often include one or more capacitors that are designed to provide very specific capacitance values. However, precision control over the capacitance of such capacitors can be difficult to achieve as it involves precisely controlling a capacitive area of the capacitor.

Precise control over capacitance is especially important in high frequency filters. Filtering of high frequency signals, such as high frequency radio signal communication, has recently increased in popularity. The demand for increased data transmission speed for wireless connectivity has driven demand for high frequency components, including those configured to operate at high frequencies, including 5G spectrum frequencies. High frequency applications often require capacitors exhibiting very low capacitance values. To obtain such capacitors, a very small capacitive area must be precisely controlled, which can further increase the difficulty of forming such precise capacitors. As such, a multilayer filter including a capacitor with a precisely controlled capacitive area would be welcomed in the art.

SUMMARY OF THE DISCLOSURE

In accordance with one embodiment of the present disclosure, a multilayer electronic device may include a plurality of dielectric layers stacked in a Z-direction that is perpendicular to an X-Y plane. The multilayer electronic device may include a first conductive layer overlying one of the plurality of dielectric layers. The multilayer electronic device may include a second conductive layer overlying another of the plurality of dielectric layers and spaced apart from the first conductive layer in the Z-direction. The second conductive layer may overlap the first conductive layer in the X-Y plane at an overlapping area to form a capacitor. The first conductive layer may have a pair of parallel edges at a boundary of the overlapping area. The first conductive layer may have an offset edge within the overlapping area that is parallel with the pair of parallel edges. The offset edge is offset from at least one of the pair of parallel edges by an offset distance that is less than about 500 microns.

In accordance with another embodiment of the present disclosure, a method of forming a frequency multilayer electronic device may include providing a plurality of dielectric layers and forming a first conductive layer overlying one of the plurality of dielectric layers. The first conductive layer may have a pair of parallel edges and an offset edge that is parallel with the pair of parallel edges. The offset edge is offset from at least one of the pair of parallel edges by an offset distance that is less than about 500 microns. The method may include forming a second conductive layer overlying another of the plurality of dielectric layers. The method may include stacking the plurality of dielectric layers in a Z-direction that is perpendicular to an X-Y plane such that the first conductive layer overlaps the second conductive layer in the X-Y plane at an overlapping area. The pair of parallel edges of the first conductive layer may intersect a boundary of the overlapping area. An offset edge of the first conductive layer may be located within the overlapping area.

In accordance with another embodiment of the present disclosure, a method of designing a capacitor of a multilayer electronic device may include calculating a target overlapping area and selecting dimensions of an overlapping area based on the target overlapping area. The method may include sizing an offset distance between an offset edge and at least one of pair of parallel edges of a conductive layer to adjust a size of the overlapping area and reduce a difference between the size of the overlapping area and a size of the target overlapping area. The pair of parallel edges of the conductive layer may be located at the boundary of the overlapping area. The offset edge may be located within the overlapping area.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 4A through 4E are a series of sequential top down views of the filter of FIGS. 3A and 3B in which an additional layer is shown in each sequential figure;

FIGS. 5A through 5D are top down views of the first capacitor through the fourth capacitor, respectively, of the multilayer filter of FIGS. 3A through 4E, according to aspects of the present disclosure;

FIG. 5E is a top down view of another embodiment of a capacitor, which may correspond with the second capacitor of the multilayer filter of FIGS. 6A through 7D, according to aspects of the present disclosure;

FIGS. 6A and 6B are perspective views of another embodiment of a multilayer filter according to aspects of the present disclosure;

FIGS. 7A through 7D are a series of sequential top down views of the filter of FIGS. 6A and 6B in which an additional layer is shown in each sequential figure;

FIG. 8B is a side elevation view of the filter of FIG. 8A;

FIGS. 9A through 9D are a series of sequential top down views of the filter of FIGS. 8A and 8B in which an additional layer is shown in each sequential Figure;

FIGS. 11A through 11D are a series of sequential top down views of the filter of FIGS. 10A and 10B in which an additional layer is shown in each sequential figure;

Figure 1:
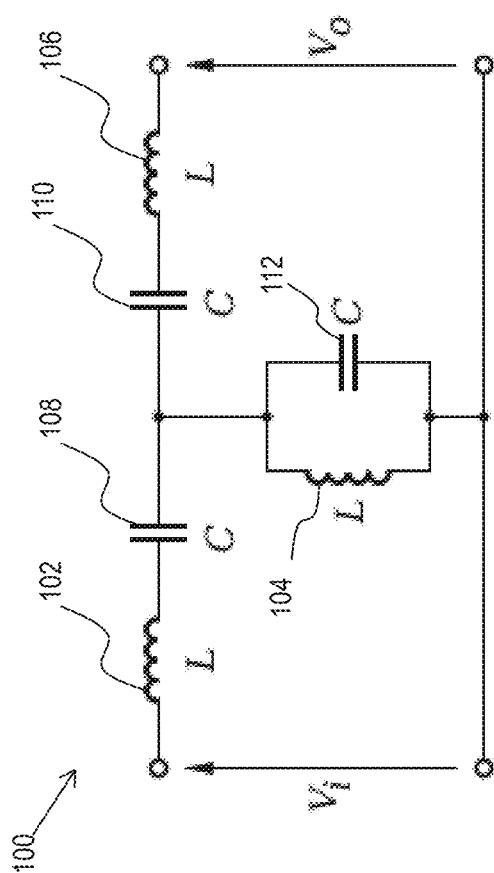
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a multilayer electronic device including a capacitor having a precisely controlled capacitive area. The multilayer electronic device may include a plurality of dielectric layers stacked in a Z-direction that is perpendicular to an X-Y plane. The multilayer electronic device may include a first conductive layer overlying one of the plurality of dielectric layers. A second conductive layer may overlie another of the plurality of dielectric layers and be spaced apart from the first conductive layer in the Z-direction. The second conductive layer may overlap the first conductive layer in the X-Y plane at an overlapping area to form a capacitor.

The first conductive layer may include a protrusion or recess that is located within the overlapping area and thus slightly adjusts the size of the overlapping area. More specifically, the first conductive layer may have a pair of parallel edges at a boundary of the overlapping area. The first conductive layer may have an offset edge that is located within the overlapping area and is parallel with the pair of parallel edges at the boundary of the overlapping area. An offset distance may be defined between the offset edge and at least one of the pair of parallel edges. The offset distance may be less than about 500 microns.

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation., and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other theremoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other theremoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetraflouroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semi-conductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In such examples, the dielectric material may have a dielectric constant that is greater than 100, for example within a range from between about 100 to about 4000, in some embodiments from about 1000 to about 3000.

One or more conductive layers may be directly formed on the dielectric layers. Alternatively a coating or intermediate layer may be located between the conductive layers and respective dielectric layers. As used herein, "formed on" may refer to either a conductive layer that is directly formed on a dielectric layer or a conductive layer that overlies the dielectric layer with an intermediate layer or coating therebetween.

The conductive layers may include a variety of conductive materials. For example, the conductive layers may include copper, nickel, gold, silver, or other metals or alloys.

In some embodiments, the multilayer electronic device may include a signal path having an input and an output. The signal path may include one or more conductive layers overlying one or more of the dielectric layers and connected with one or more vias.

Vias may be formed in one or more of the dielectric layers. For example, a via may electrically connect a conductive layer on one dielectric layer with a conductive layer on another dielectric layer. The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper. The vias may be filled with conductive material such that a solid column of conductive material is formed. Alternatively, the interior surfaces of the through holes may be plated such that the vias are hollow.

In some embodiments, the multilayer electronic device may include an inductor. The inductor may include a conductive layer formed on one of the plurality of dielectric layers. The inductor may be electrically connected at a first location with the signal path and electrically connected at a second location with at least one of the signal path or a ground. For example, the inductor may form a portion of the signal path or may be connected between the signal path and ground.

In some embodiments, at least one of the dielectric layers may have a thickness that is less than about 180 microns, in some embodiments less than about 120 microns, in some embodiments less than about 100 microns in some embodiments less than about 80 microns, in some embodiments less than 60 microns, in some embodiments less than about 50 microns, in some embodiments less than about 40 microns, in some embodiments less than about 30 microns, and in some embodiments less than about 20 microns.

One or more vias may be formed in the dielectric layers. The via(s) may electrically connect the different conductive layers. The vias may have lengths that are less than about 180 microns, in some embodiments less than about 100 microns, and in some embodiments less than about 80 microns.

The via(s) may have a variety of suitable widths. For example, in some embodiments the width of the via may range from about 20 microns to about 200 microns, in some embodiments from about 40 microns to about 180 microns, in some embodiments from about 60 microns to about 140 microns, and in some embodiments from about 80 microns to about 120 microns.

In some embodiments, the multilayer electronic device may be configured as a filter. The filter may be configured for operation at high frequencies. The multilayer filter may have a characteristic frequency (e.g., a low pass frequency, a high pass frequency, an upper bound of a bandpass frequency, or a lower bound of the bandpass frequency) that is greater than 6 GHz. In some embodiments, the filter may have a characteristic frequency that is greater than about 6 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments in some embodiments greater than about 80 GHz.

The filter may exhibit excellent performance characteristics, such as low insertion loss for frequencies within a pass band frequency range of the filter. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the filter may exhibit excellent rejection of frequencies outside the pass band frequency range. In some embodiments, the insertion loss for frequencies outside the pass band frequency range may be less than about −15 dB, in some embodiments less than about −25 dB, in some embodiments less than about −35 dB, and in some embodiments less than about −40 dB.

Additionally, the filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The filter may also exhibit consistent performance characteristics (e.g., insertion loss, return loss, etc.) across a wide range of temperatures. In some embodiments, the insertion loss of the filter may vary less than 5 dB or less across large temperature ranges. For example, the filter can exhibit a first insertion loss at about 25° C. and at a first frequency. The filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

However, it should be understood that in other embodiments, the multilayer electronic device may be any suitable type of device that includes a capacitor. For example the multilayer electronic device may be a multilayer capacitor, multilayer capacitor array, multilayer transformer (e.g., a balun), etc.

In some embodiments, the device may have an overall length that ranges from about 0.5 mm to about 30 mm, in some embodiments, from about 1 mm to about 15 mm, and in some embodiments from about 2 mm to about 8 mm.

In some embodiments, the device may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The device may generally be low-profile or thin. For example, in some embodiments, the device may have an overall thickness that ranges from about 100 microns to about 2 mm, in some embodiments from about 150 microns to about 1 mm, and in some embodiments from about 200 microns to about 300 microns.

Regardless of the particular configuration employed, the present inventors have discovered that through selective control over the shape of conductive layers of a capacitor, precise control over the capacitance of the capacitor can be achieved. More specifically, precise control can be achieved over a size of an overlapping area formed between the conductive layers. The first conductive layer may be include a protrusion or recess that is located within the overlapping area and thus slightly adjusts the size of the overlapping area.

The first conductive layer may have a pair of parallel edges at a boundary of the overlapping area. The first conductive layer may have an offset edge that is located within the overlapping area and is parallel with the pair of parallel edges at the boundary of the overlapping area. An offset distance may be defined between the offset edge and at least one of the pair of parallel edges. The offset distance may be less than about 500 microns, in some embodiments less than about 400 microns, in some embodiments less than about 300 microns, in some embodiments less than about 200 microns, in some embodiments less than about 100 microns, in some embodiments less than about 75 microns, and in some embodiments less than about 50 microns.

The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to for form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

A finite resolution or feature size is achievable regardless of the particular process employed. A "minimum line width" may be defined as the smallest, accurately producible feature size of the process or processes employed. In some embodiments, the minimum line width may be about 100 microns or less, in some embodiments about 75 microns or less, and in some embodiments about 50 microns or less. A "minimum area unit" may be defined as the minimum line width squared. The minimum area unit may be about 0.01 mm$^2$ or less, in some embodiments about 0.0052 mm$^2$ or less, and in some embodiments about 0.0026 mm$^2$ or less.

In some embodiments, the capacitor may be insensitive to small, relative misalignment between the dielectric layers on which the conductive layers are formed. As such, the capacitor may be described as "self-aligning." For example, the first conductive layer may be dimensionally smaller than the second conductive layer. The first conductive layer may be located within the perimeter of the second conductive layer in the X-Y plane. As another example, the first conductive layer may be elongated in a first direction and overlap the second conductive layer such that the edges of the second capacitor bound the overlap area in the first direction. The edges of the first conductive layer may bound the overlapping area in a second direction that is perpendicular to the first direction.

The protrusion or recess as described herein may permit precise selection or adjustment of the size of the overlapping area formed between the two conductive layers. More specifically, the protrusion or recess may allow the size of the overlapping area to be increased or decreased by as few as one minimum area unit. Such precision may allow greater control over the overlapping area than simply increasing the width of one of the conductive layers by the minimum line width.

The protrusion or recess may be arranged at least partially within the overlapping area such that the overlapping area remains insensitive to slight relative misalignment between the conductive layers. For example, the protrusion or recess may be associated with a width discontinuity edge. The width discontinuity edge may be located at least one minimum line width from an edge of the overlapping area such that slight misalignment does not cause the protrusion or recess to intersect a boundary of the overlapping area.

The protrusion or recess may be small in size. As a result the protrusion or recess may increase or decrease the overlapping area by a small amount. For example, the protrusion or recess may have an area that is less than about 0.2 mm$^2$, in some embodiments less than about 0.15 mm$^2$, in some embodiments less than about 0.1 mm$^2$, in some embodiments less than about 0.05 mm$^2$, in some embodiments less than about 0.01 mm$^2$, in some embodiments less than about 0.005 mm$^2$, in some embodiments less than about 0.0026 mm$^2$, and in some embodiments less than about 0.001 mm$^2$. The protrusion or recess may have an area that ranges from 1 to 20 minimum area units, in some embodiments from 1 to 10 minimum area units, in some embodiments from 1 to 5 minimum area units, in some embodiments from 1 to 3 minimum area units.

The protrusion or recess may have a length or width that is less than about 400 microns, in some embodiments less than about 300 microns, in some embodiments less than about 200 microns, in some embodiments less than about 100 microns, in some embodiments less than about 75 microns, and in some embodiments less than about 50 microns. The protrusion or recess feature(s) may have a length or width that is less than about 10 minimum line widths, in some embodiments less than about 8 minimum line widths, in some embodiments less than about 4 minimum line widths, in some embodiments less than about 3 minimum line widths, and in some embodiments about 1 minimum line width.

The capacitor may have a small overlapping area (e.g., capacitive area). For example, in some embodiments the capacitive area of the capacitor may be less than about 0.5 square millimeters (mm$^2$), in some embodiments less than about 0.3 mm$^2$, in some embodiments less than about 0.2 mm$^2$, in some embodiments less than about 0.1 mm$^2$, in some embodiments less than about 0.05 mm$^2$, and in some embodiments less than about 0.02 mm$^2$.

The filter may include a first layer of a first dielectric material between electrodes of the capacitor(s). The first dielectric material may be distinct from a second dielectric material of another layer of the filter. For example, the first dielectric material between the electrodes may comprise a ceramic-filled epoxy. The first dielectric material may have a dielectric constant that ranges from about 5 to about 9, in some embodiments from about 6 to about 8. The second dielectric material may comprise an organic dielectric material, for example, as described above. The second dielectric material may have a dielectric constant that ranges from about 1 to about 5, in some embodiments from about 2 to about 4.

The area of the protrusion or recess may account for a small portion of the overlapping area of the capacitor. For example, in some embodiments an overlapping-area-to-feature-area ratio may be defined as a ratio of the area of the overlapping area to the area of the protrusion or recess within the overlapping area. The overlapping-area-to-feature-area ratio may be greater than about 1, in some embodiments greater than about 2, in some embodiments greater than about 5, in some embodiments greater than about 7, in some embodiments greater than about 10, in some embodiments greater than about 15, and in some embodiments greater than about 30.

The first conductive layer of the capacitor may be spaced apart from the second conductive of the capacitor by less than about 100 microns, in some embodiments less than about 80 microns, in some embodiments less than about 60 microns, in some embodiments less than about 40 microns, and in some embodiments about 20 microns, or less.

I. Multilayer Filter

FIG. 1 is a simplified schematic of a multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
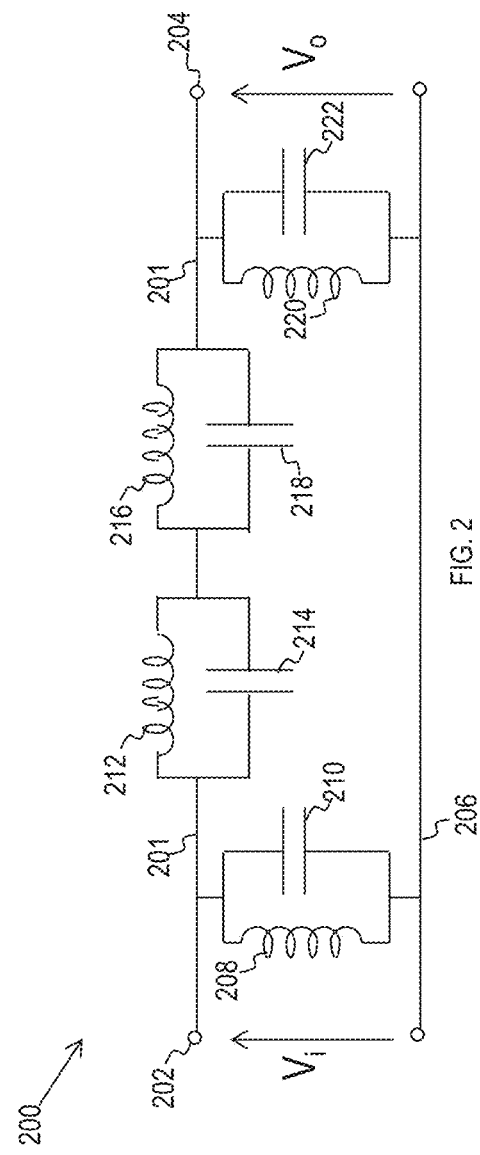
FIG. 2 is a simplified schematic of another band pass filter according to aspects of the present disclosure.

FIG. 2 is a schematic of an example embodiment of a band pass filter 200 according to aspects of the present disclosure. A signal path 201 may be defined between an input 202 and an output 204 of the filter 200. An input voltage (represented by $V_i$ in FIG. 1) may be input to the filter 200 between the input 202 and a ground 206 of the filter 200. An output voltage (represented by $V_o$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 210 and third capacitor 214 electrically connected in parallel with each other. The third inductor 210 and third capacitor 214 may be electrically connected between the signal path 201 and the ground 206. The third inductor 210 and third capacitor 214 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired band pass frequency range of the band pass filter 200. The band pass filter 200 may significantly reduce frequencies outside of the passband frequency range while allowing frequencies within a passband frequency range to be transmitted through the filter 200 substantially unaffected.

Figure 3A:
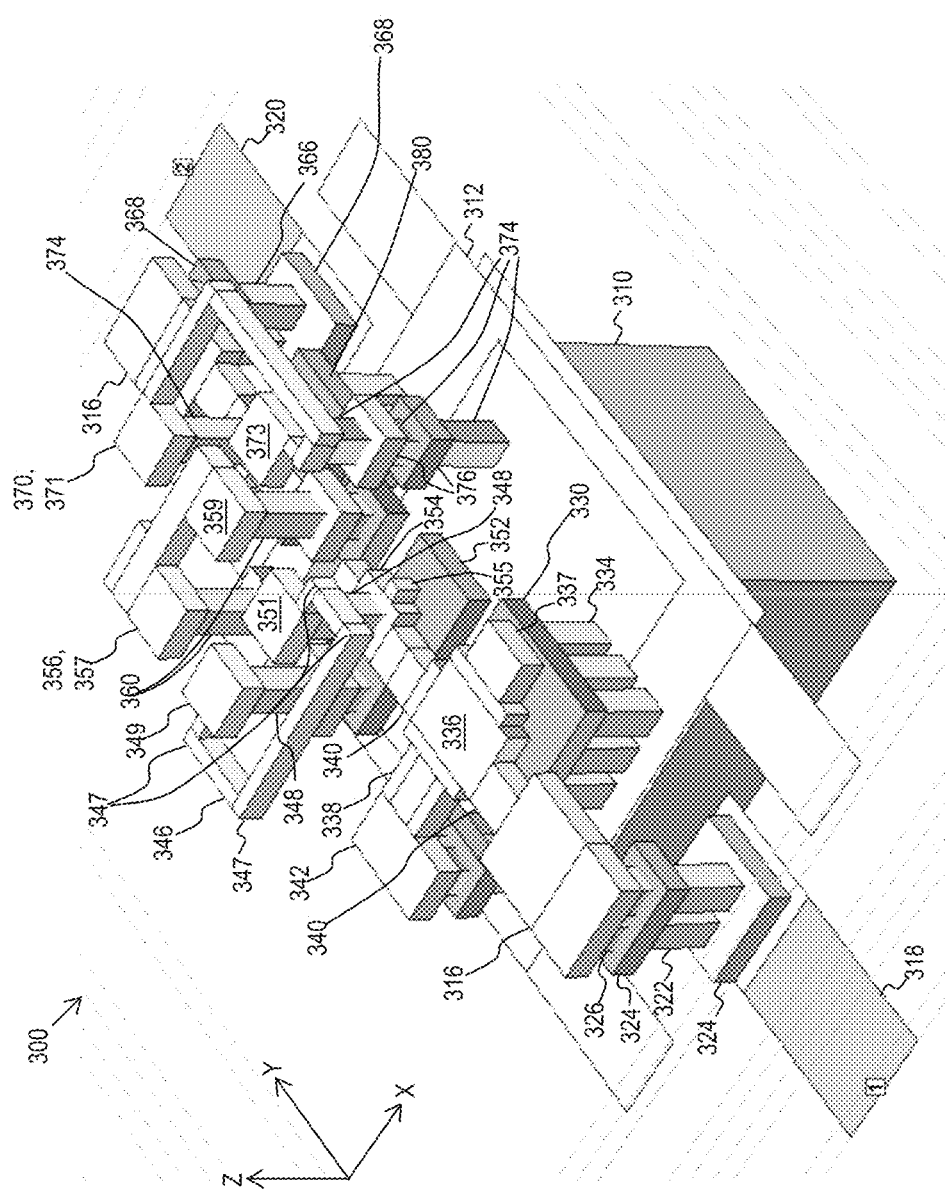
FIGS. 3A and 3B are perspective views of an example band pass filter according to aspects of the present disclosure.
Figure 3B:
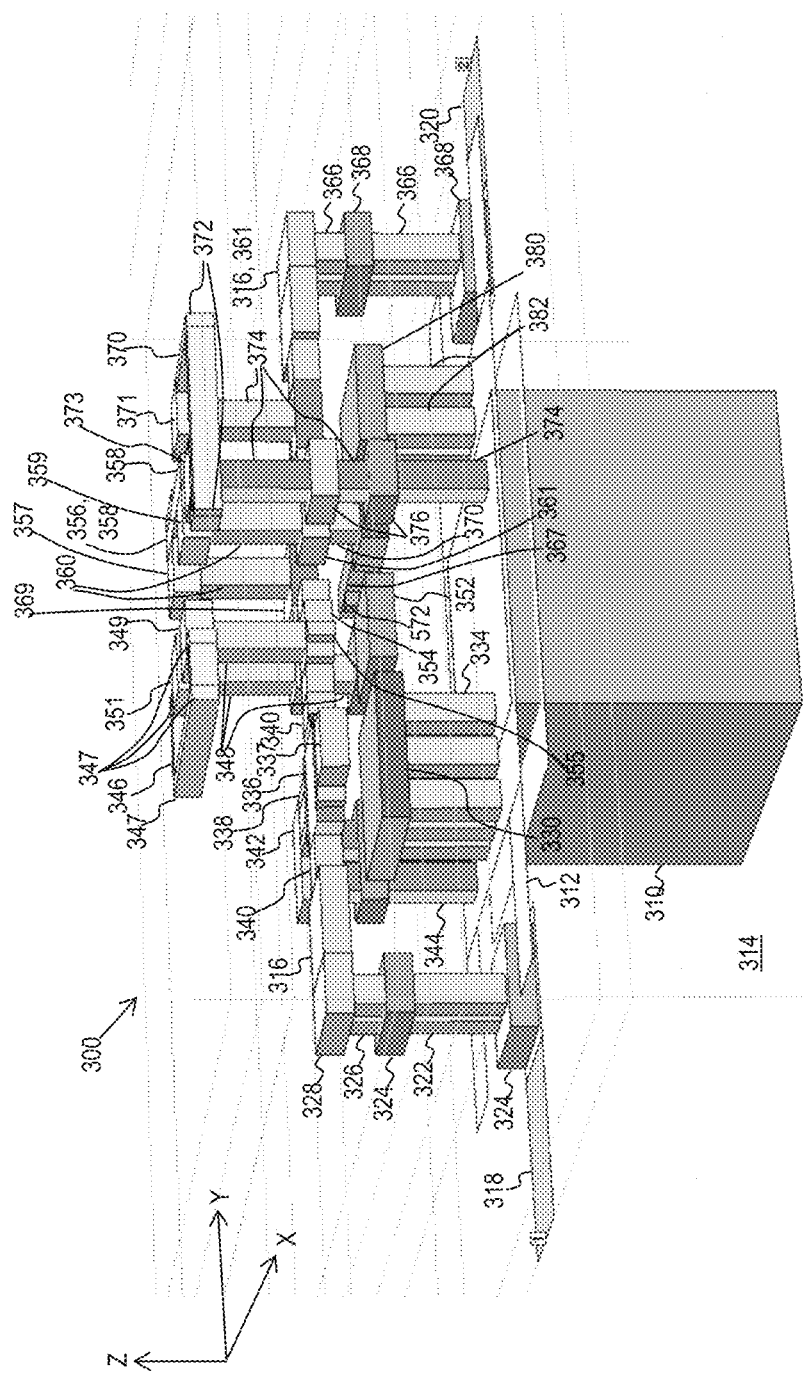
Figure 3C:
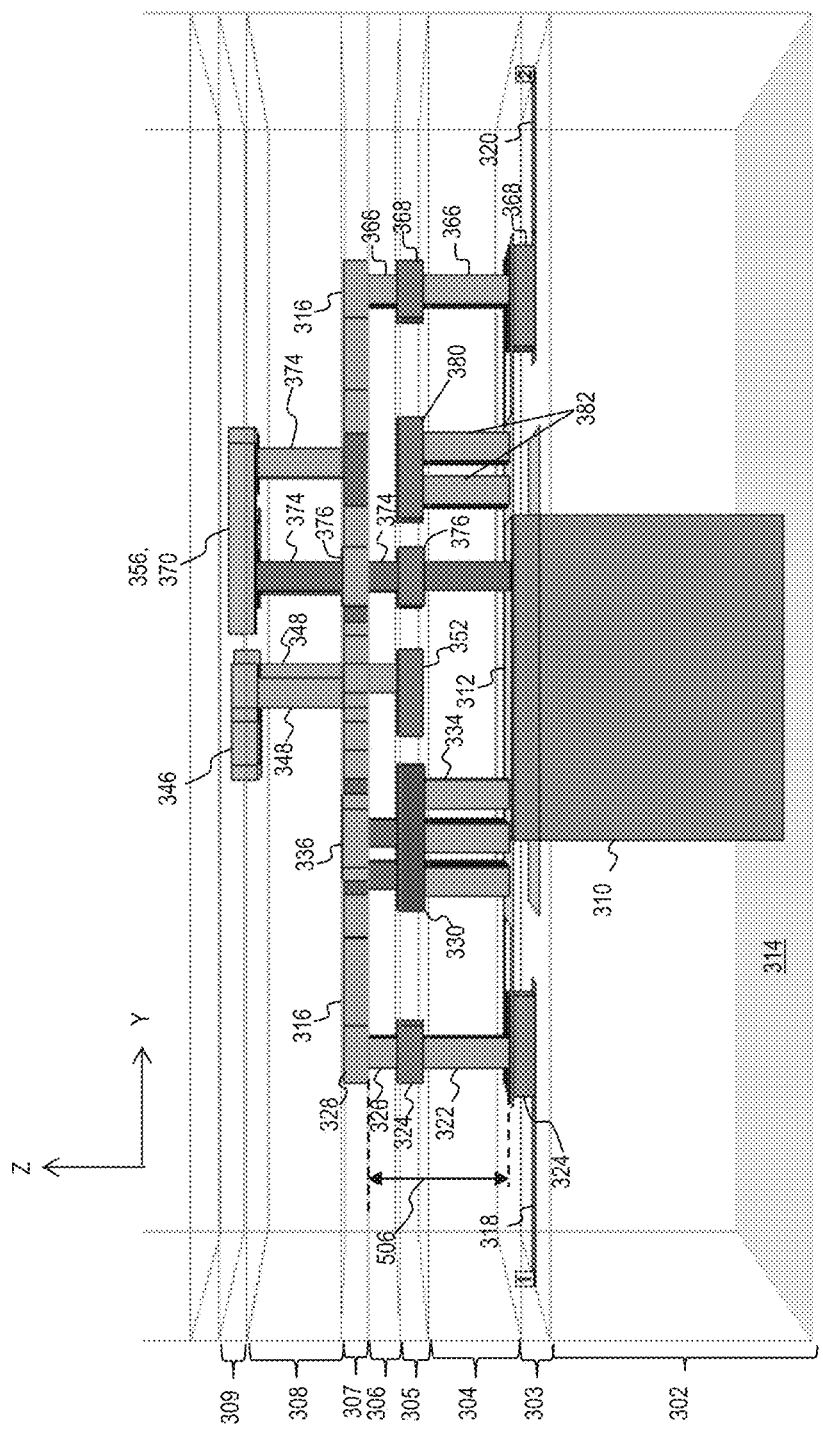
FIG. 3C is a side elevation view of the filter of FIGS. 3A and 3B.

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed on the dielectric layers 304, 306, 308. Conductive layer 303 may be formed on a bottom surface of the first dielectric layer 304. Conductive layers 305, 307 may be formed on a top surface and a bottom surface, respectively of the second dielectric layer 306. A ground may include a ground plane 312 that is exposed and/or terminated along a bottom surface of the filter 300 (the bottom surface of conductive layer 303. The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the mounting surface 302 and the first conductive layer 303. FIG. 4B illustrates the ground plane 312 formed on the bottom surface of the first dielectric layer 304. FIG. 4C additionally illustrates the conductive layer 305 formed on the top surface of the first dielectric layer 304. FIG. 4D additionally illustrates conductive layer 307 that is formed on the second dielectric layer 306. FIG. 4E illustrates the conductive layer 309 formed on the third layer 308. The dielectric layers 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 may electrically connecting the input 318 with an intermediary conductive layer 324 disposed between the first layer 304 and second layer 306. The signal path 316 may include one or more vias 326 electrically connecting the intermediary layer 324 with a conductive layer 328 formed on the second dielectric layer 306.

A first capacitor may be formed between a portion 336 of the signal path 316 formed on an upper surface of the second layer 360 and a conductive layer 330 formed on a lower surface of the second layer 306 of dielectric material. The second layer 306 may have a different dielectric constant than one or more of the other layers 304, 308. For example, the dielectric material of the second layer 306 having a dielectric constant that ranges from about 5 to about 8 in accordance with IPC TM-650 2.5.5.3 at an operating temperature of 25° C. and frequency of 1 MHz. One or more of the other layers 304, 308 may have a dielectric constant that ranges from about 1 to about 4 in accordance with IPC TM-650 2.5.5.3 at an operating temperature of 25° C. and frequency of 1 MHz.

The conductive layer 330 may be electrically connected with the ground plane 312. The first capacitor of the filter 300 may correspond with the first capacitor 210 of the circuit diagram 200 of FIG. 2. The conductive layer 330 may be capacitively coupled with a portion 336 of the signal path 316. The conductive layer 330 may be spaced apart from the portion 336 of the signal path 316 in a Z-direction. The conductive layer 330 may be electrically connected with the ground plane 312 by one or more vias 334.

The first capacitor may be insensitive to relative misalignment of the electrodes of the first capacitor, which may be described as being "self-aligning." As best seen in FIG. 4D, the portion 336 of the signal path 316 may generally be dimensionally smaller (e.g., in the X- and Y-directions) than the conductive layer 330 of the first capacitor. Additionally the portion 336 of the signal path 316 may define connections in the X-Y plane with other elements and other parts of the signal path 316. Such connections may be sized such that a slight misalignment in the X-direction or Y-direction does not change a capacitive area of the first capacitor. More specifically, a size of an effective overlap area (e.g., in the X-Y plane) between the conductive layer 330 and the portion 336 of the signal path 316 may be insensitive to slight misalignment in the X-direction or Y-direction of the second and third layers 304, 306.

For example, the portion 336 of the signal path 316 may include a tab 337 (e.g., extending in the X-direction) that has a width (e.g., in the Y-direction) equal to a width (e.g., in the Y-direction) of the connector portion 338 on an opposite side of the portion 336. Similarly, connections 340 may extend from opposite sides of the portion 336 (e.g., in the Y-direction) that may have equal widths. As a result, relative misalignment in the Y-direction may not alter the overlapping area between the conductive layer 330 and the portion 336 of the signal path 316.

The filter 300 may include a first inductor 342 electrically connected with the signal path 316 and ground plane 312. The first inductor 342 of the filter 300 may correspond with the first inductor 208 of the circuit diagram 200 of FIG. 2. The first inductor 342 may be connected with the portion 336 of the signal path 316 that forms the first capacitor by a connector portion 338. The first inductor 342 may be electrically connected with the ground plane 312 by one or more vias 344 (best seen in FIG. 3B).

The signal path 316 of the filter 300 may include a second inductor 346, which may correspond with the second inductor 212 of the circuit diagram 200 of FIG. 2. The second inductor 346 may be formed on the third layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the first inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the first inductor 346 may form greater than half of a "loop."

The second capacitor may be formed between the conductive layer 352 and the portion 354 of the signal path 316. The second capacitor may correspond with the second capacitor 214 of the circuit diagram 200 of FIG. 2. The second capacitor may be a self-aligning capacitor. The second capacitor may include one or a protrusion 552, for example as described below with reference to FIG. 5B.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by one or more vias 366 and/or intermediary layers 368. In other words, the third inductor 356 may form a portion of the signal path 316 between the second inductor 346 and the output 320.

A third capacitor may be formed in parallel with third inductor 356. The third capacitor may correspond with the third capacitor 214 of the circuit diagram 200 of FIG. 2. The third capacitor of the filter 300 may include a conductive layer 367 that is capacitively coupled with the portion 369 of the signal path 316. The third capacitor may include a protrusion 572, for example as described below with reference to FIG. 5C.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2. The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 that is capacitively coupled with the portion 361 of the signal path 316 that is connected with the output 320. The conductive layer 380 of the fourth capacitor may be electrically connected with the ground plane 312 by vias 382. The fourth capacitor may correspond with the fourth capacitor 222 of the circuit diagram 200 of FIG. 2. The fourth capacitor may be self-aligning and may include a protrusion 583, for example as described below with reference to FIG. 5D.

II. Example Capacitors

FIGS. 5A through 5D are top down views of the first through fourth capacitors, respectively, of the multilayer filter 300. Referring to FIG. 5A, the first capacitor may include a first conductive layer 502 (e.g., the portion 336 of the signal path 316) and a second conductive layer 504 (e.g., the conductive layer 330) that are spaced apart in the Z-direction. The first conductive layer 502 and second conductive layer 504 may overlap in the X-Y plane at an overlapping area. The overlapping area may be insensitive to relative misalignment between the first and second conductive layers 502, 504. Thus, the first capacitor may be described as "self-aligning." More specifically, the first conductive layer 502 may include the tab 337 and the connector portion 338, which each extend in the X-direction from the portion 336 and have equal widths 500 at boundaries 501 of the overlapping area. Similarly, the first conductive layer 502 may include connections 340 that extend in the Y-direction and have equal widths 503. As a result, relative misalignment in the X- and Y-directions may not alter the size of the overlapping.

The first conductive layer 502 may have a pair of parallel edges 506, 508 at a boundary 510 of the overlapping area. The parallel edges 506, 508 may be parallel with each other and spaced apart in the X-direction by the width 503 of the connection 340.

The first conductive layer 502 may have an offset edge 512 that is within the overlapping area and parallel with the pair of parallel edges 506, 508. The offset edge 512 may extend in the Y-direction. An offset distance 514 may be defined between the offset edge 512 and a first edge 506 of the pair of parallel edges 506, 508. The offset distance 514 may be defined between the edge 506 of the parallel edges 506, 508 that is closest to the offset edge 512. The offset distance 514 may be less than about 500 microns.

The first conductive layer 502 may include additional offset edges 516. The additional offset edges 516 may have respective additional offset distances 518 defined with respect to a closer of the pair of parallel edges 506, 508. One or more of the additional offset distances 516 may be less than about 500 microns.

The first conductive layer 502 may have a first width 520 between the pair of parallel edges 506, 508 in a direction that is perpendicular to the parallel edges 506, 508 (e.g., the X-direction). The first conductive layer 502 may have a second width 522 at the offset edge 512 in a direction perpendicular to the offset edge (e.g., the X-direction). The second width 522 may be greater than the first width 520. The second width 522 may equal the first width 520 plus the offset distance 514.

A width discontinuity edge 524 may extend between the offset edge 512 and the first edge 506 (e.g., the closer edge) of the pair of parallel edges 506, 508. The width discontinuity edge 524 may be perpendicular to the parallel edges 506, 508 and/or the offset edge 512. Additional width discontinuity edges 526 may be associated with the additional offset edges 516.

One or more protrusions 528 (represented by cross-hatching in FIG. 5A) may be formed by the offset edges 512, 516. The protrusions 528 may be defined as portions of the first conductive layer 502 that lie outside the intersection of the parallel edges 506, 508 with edges of the connector portion 338 defined by the width 500 of the connector portion at the boundary 501 of the overlapping area. The protrusions 528 may increase the size of the overlapping area and thus increase the resulting capacitance of the first capacitor. The size and of the various protrusions 528 can be selected to fine tune the size of the overlapping area and thus fine tune a precise capacitance of the first capacitor.

More specifically, to retain the self-aligning properties of the first capacitor, the widths 500 of the tab 337 and connector portion 338 near the boundary 501 of the conductive layer 330 should remain equal. Similarly the widths 503 of connections 340 should remain equal. However, the techniques used to pattern and form the conductive layers have a finite resolution. A minimum line width (represented by grid points within the conductive layer and by arrow 508) may be defined as the smallest feature size that can be accurately patterned. A "minimum area unit" may be defined as the minimum line width 508 squared (e.g., about 0.0026 mm$^2$) and is represented in FIG. 5A as one square unit in the grid. Including the one or more offset edges 512, 516 to define protrusions 528 within the overlapping area may be used to make very small adjustments to the size of the overlapping area.

Referring to FIG. 5B, the second capacitor of the multilayer filter 300 may define an overlapping area between the conductive layer 352 and the portion 354 of the signal path 316. A first conductive layer 530 (the portion 354 of the signal path 316) may be elongated in the Y-direction and overlap a second conductive layer 532 (conductive layer 352) at an overlapping area in the X-Y plane. The overlapping area may be insensitive to small misalignment between conductive layers 530, 532.

The first conductive layer 530 may have a pair of parallel edges 534, 536 at a boundary 538 of the overlapping area. The parallel edges 534, 536 may be parallel with each other and spaced apart in the X-direction by a first width 540 of the first conductive layer 530.

The first conductive layer 530 may have an offset edge 542 that is within the overlapping area and parallel with the pair of parallel edges 534, 536. The offset edge 542 may extend in the Y-direction. An offset distance 543 may be defined between the offset edge 542 and a first edge 534 of the pair of parallel edges 506, 508. The offset distance 514 may be defined between the edge 534 of the parallel edges 534, 536 that is closest to the offset edge 542. The offset distance 542 may be less than about 500 microns.

The first conductive layer 530 may include an additional offset edge 544 that is offset from the parallel edge 534 by an additional offset distance 546. The additional offset distance 546 may be less than about 500 microns.

The first conductive layer 530 may have the first width 540 between the pair of parallel edges 534, 536 in a direction that is perpendicular to the parallel edges 534, 536 (e.g., the X-direction). The first conductive layer 530 may have a second width 548 at the offset edge 542 in a direction perpendicular to the offset edge 542 (e.g., the X-direction). The second width 548 may be greater than the first width 540. The second width 548 may equal the first width 540 plus the offset distance 543.

A width discontinuity edge 548 may extend between the offset edge 542 and the first edge 534 (e.g., the closer edge) of the pair of parallel edges 534, 536. The width discontinuity edge 548 may be perpendicular to the parallel edges 534, 536 and/or the offset edge 542. An additional width discontinuity edge 550 may be associated with the additional offset edge 544.

A protrusion 552 (represented by cross-hatching in FIG. 5B) may be formed by the offset edges 542, 544. The protrusion 552 may be defined as the portion of the first conductive layer located outside of the parallel edges 543, 536 of the first conductive layer 530. The protrusion 552 may increase the size of the overlapping area and thus increase the resulting capacitance of the second capacitor. The size and of the various protrusions 552 can be selected to fine tune the size of the overlapping area and thus fine tune a precise capacitance of the second capacitor.

Referring to FIG. 5C, the third capacitor of the multilayer filter 300 may include an overlapping area formed between a first conductive layer 556 (conductive layer 367) and a second conductive layer 558 (the portion 359 of the signal path 316). The third capacitor may be "self-aligning" such that the overlapping area is insensitive to relative misalignment between the first conductive layer 556 and the second conductive layer 558.

The first conductive layer 556 may include has an offset edge 560 located within the overlapping area that is parallel with a pair of parallel edges 562, 564 defined at a boundary 566 of the overlapping area in a similar manner as described above with reference to FIGS. 5A and 5B. An offset distance 568 may be defined between the offset edge 560 and at least one of the pair of parallel edges 562, 564 in a similar manner as described above with reference to FIGS. 5A and 5B. Additionally, a width discontinuity edge 570 may be located parallel with the parallel edges 562, 564. The offset edge 560 may have a length 571 in a direction parallel with the offset edge 560 (e.g., the Y-direction).

The first conductive layer 556 may include a protrusion 572 (represented by cross-hatching in FIG. 5C) that lies outside of pair of parallel edges 562, 564 and within the overlapping area. In this example the protrusion 572 may have an area equal to a single minimum area unit, which may be defined as the minimum line width 508 squared (e.g., about 0.0026 mm$^2$).

Referring to FIG. 5D, the third capacitor of the multilayer filter 300 may include an overlapping area formed between a first conductive layer 574 (the portion 361 of the signal path 316) and a second conductive layer 575 (conductive layer 380). The third capacitor may be "self-aligning" such that the overlapping area is insensitive to relative misalignment between the first conductive layer 574 and the second conductive layer 575.

The first conductive layer 574 may include has an offset edge 576 located within the overlapping area that is parallel with a pair of parallel edges 577, 578 defined at a boundary 579 of the overlapping area in a similar manner as described above with reference to FIGS. 5A and 5B. An offset distance 580 may be defined between the offset edge 576 and at least one of the pair of parallel edges 577, 578 in a similar manner as described above with reference to FIGS. 5A and 5B. Additionally, a width discontinuity edge 582 may be located parallel with the parallel edges 577, 578. The offset edge 576 may have a length 581 in a direction parallel with the offset edge 576 (e.g., the Y-direction).

The first conductive layer 574 may include a protrusion 583 (represented by cross-hatching in FIG. 5D) that lies outside of pair of parallel edges 577, 578 and within the overlapping area.

Referring to FIG. 5E, another capacitor 584 is illustrated, which may correspond with a second capacitor 618 of another multilayer filter 600, which is described below with reference to FIGS. 6A through 7D. The capacitor 584 may include an overlapping area formed between a first conductive layer 585 and a second conductive layer 586. The capacitor 584 may be "self-aligning" such that the overlapping area is insensitive to relative misalignment between the first conductive layer 585 and the second conductive layer 586.

The first conductive layer 585 may include has an offset edge 587 located within the overlapping area that is parallel with a pair of parallel edges 588, 589 defined at a boundary 590 of the overlapping area in a similar manner as described above with reference to FIGS. 5A and 5B. An offset distance 591 may be defined between the offset edge 587 and at least one of the pair of parallel edges 588, 589 in a similar manner as described above with reference to FIGS. 5A and 5B. Additionally, a width discontinuity edge 593 may be located parallel with the parallel edges 588, 589. The offset edge 587 may have a length 592 in a direction parallel with the offset edge 589 (e.g., the Y-direction).

The first conductive layer 585 may define a recess 594. The recess 594 may be located at least partially between the parallel edges 588, 589. The offset edge 587 may be located between the parallel edges 588, 589. In other words, the offset distance 591 may be negative (when compared with the previous embodiments). The recess 594 may reduce the size of the overlapping area and thus reduce the capacitance of the capacitor. The capacitor 584 may be still be "self-aligning" as a width 595 of the first conductive layer 585 is the same at each boundary 590 of the overlapping area.

III. Additional Example Embodiments

Figure 6A:
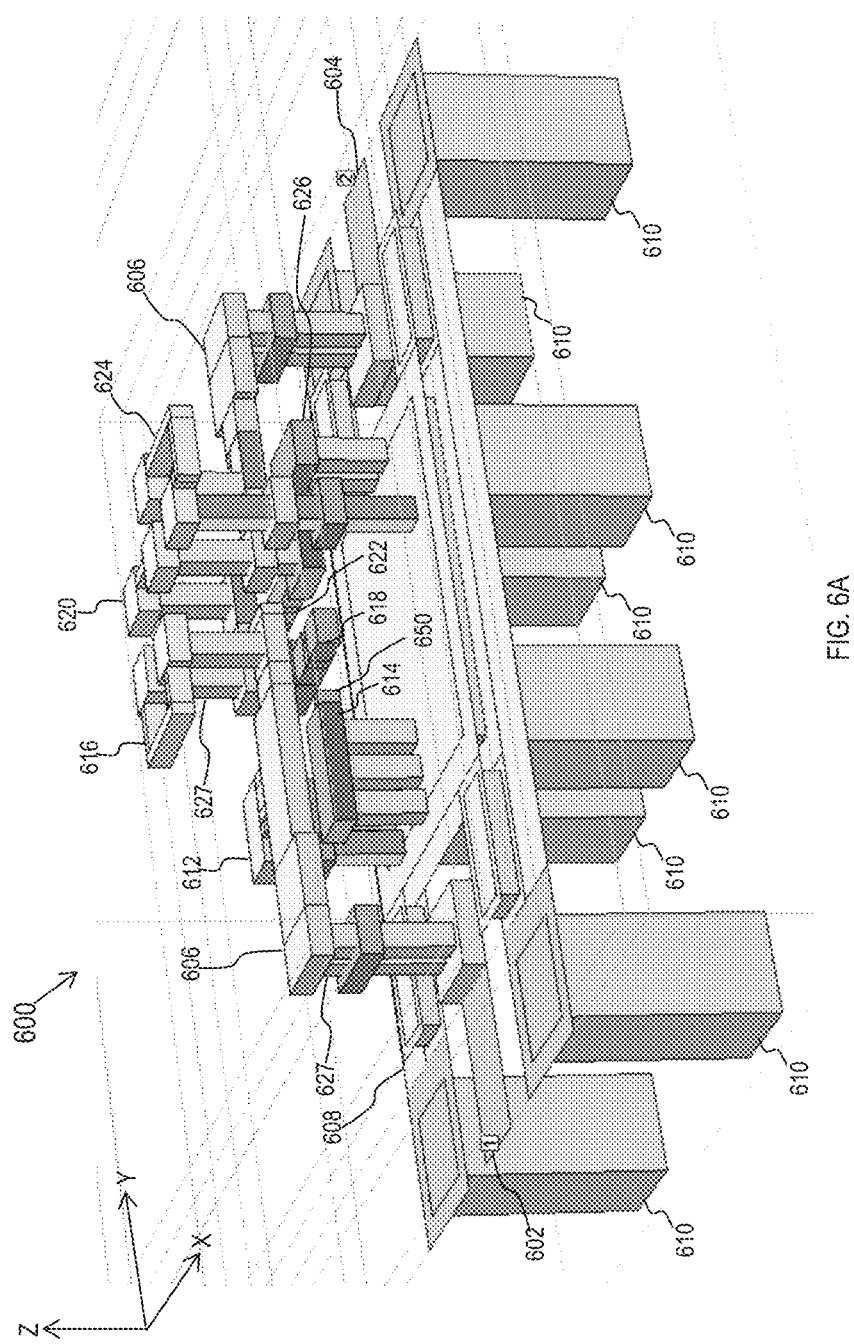

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5D. The filter 600 may include an input 602, an output 604, and a signal path 606 connecting the input 602 and the output 604. The filter 600 may also include a ground plane 608 electrically connected with one or more ground electrodes 610.

The filter 600 may include a first inductor 612 that is electrically connected with the ground plane 608. The first inductor 612 may correspond with the first inductor 208 of the circuit diagram 200 described above with reference to FIG. 2. The filter 600 may include a first capacitor 614 electrically coupled with the ground plane 608. The first capacitor 614 may correspond with the first capacitor 210 of the circuit diagram 200 described above with reference to FIG. 2.

The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output 604. The filter 600 may include a third inductor 620 and third capacitor 622 that are connected in parallel with each other and may form a portion of the signal path 606 between the input 602 and the output 604. The third inductor 620 and third capacitor 622 may correspond with the third inductor 216 and third capacitor 218, respectively, of the circuit diagram 200 described above with reference to FIG. 2. Lastly, the filter 600 may include a fourth inductor 624 and fourth capacitor 626 that are connected in parallel with each other and connected between the signal path 606 and the ground plane 608. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias 627 in a similar manner as described above with reference to FIGS. 3 through 5D. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

Figure 6C:
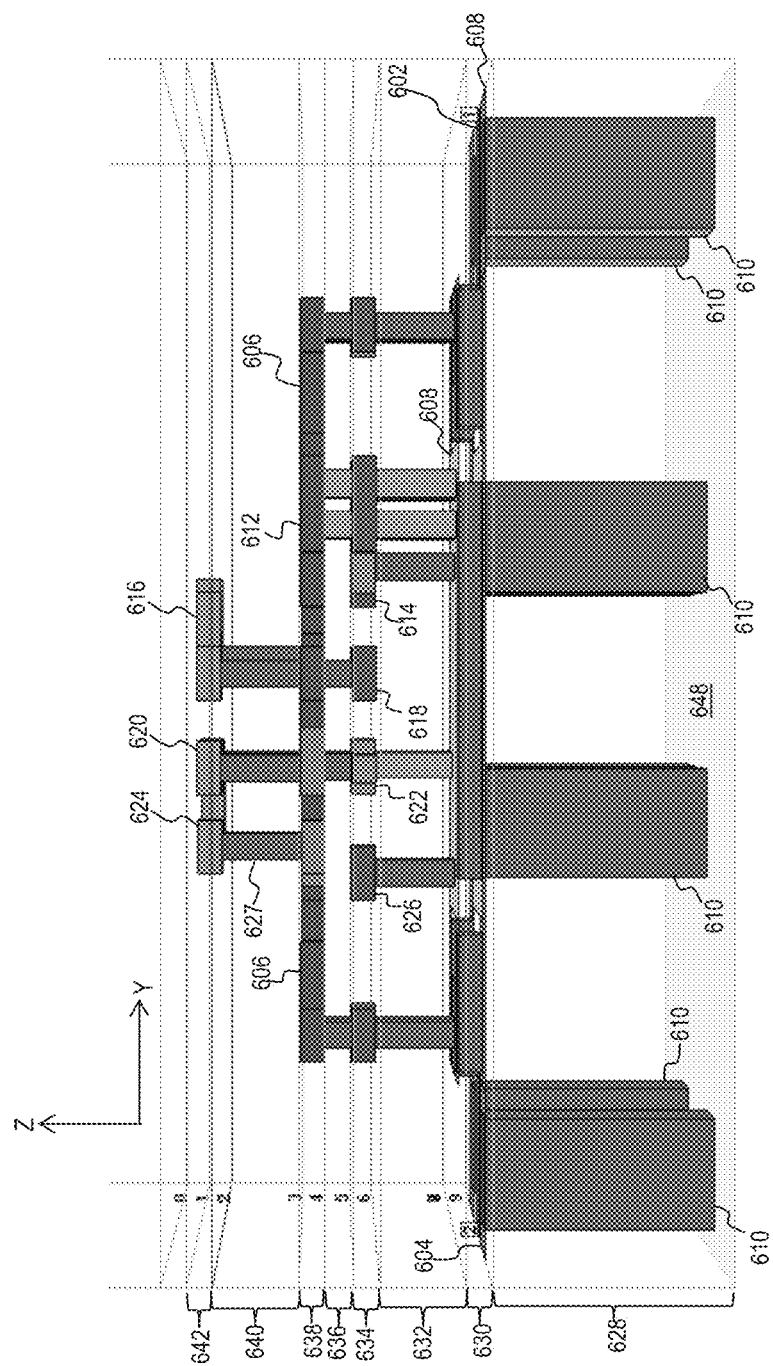
FIG. 6C is a side elevation view of the filter of FIGS. 6A and 6B.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure. Conductive layers 630, 634, 638, 642 may be formed on the dielectric layers 632, 636, 640.

Conductive layer 630 may be formed on a bottom surface of the first dielectric layer 632. Conductive layers 634, 638 may be formed on a top surface and a bottom surface, respectively of the second dielectric layer 636. Conductive layer 642 may be formed on a top surface of the third dielectric layer 640.

FIGS. 7A through 7D are a series of sequential top down views of the filter 600 of FIGS. 6A through 6C in which an additional dielectric layer is shown in each Figure. More specifically, FIG. 7A illustrates a mounting surface 628, such a printed circuit board. The first conductive layers 630 may include the ground plane 608, which may be formed on a bottom surface and a top surface of the first layer 632. FIG. 7B additionally illustrates the second conductive layer 634 formed on the first dielectric layer 632. The second conductive layer 634 may include the first capacitor 614, second capacitor 618, third capacitor 622 and forth capacitor 626. FIG. 7C additionally illustrates the third conductive layer 638 that is formed on the second dielectric layer 636. The third conductive layer 638 may include portions of the signal path 606 and the first inductor 612. FIG. 7D illustrates the fourth conductive layer 642 formed on the fourth dielectric layer 640. The fourth conductive layer 642 may include the second inductor 616, third inductor 622, and fourth inductor 624. The dielectric layers 632, 636, 640 are transparent to show the relative relocations of the various patterned conductive layers 630, 634, 638, 642.

Figure 8A:
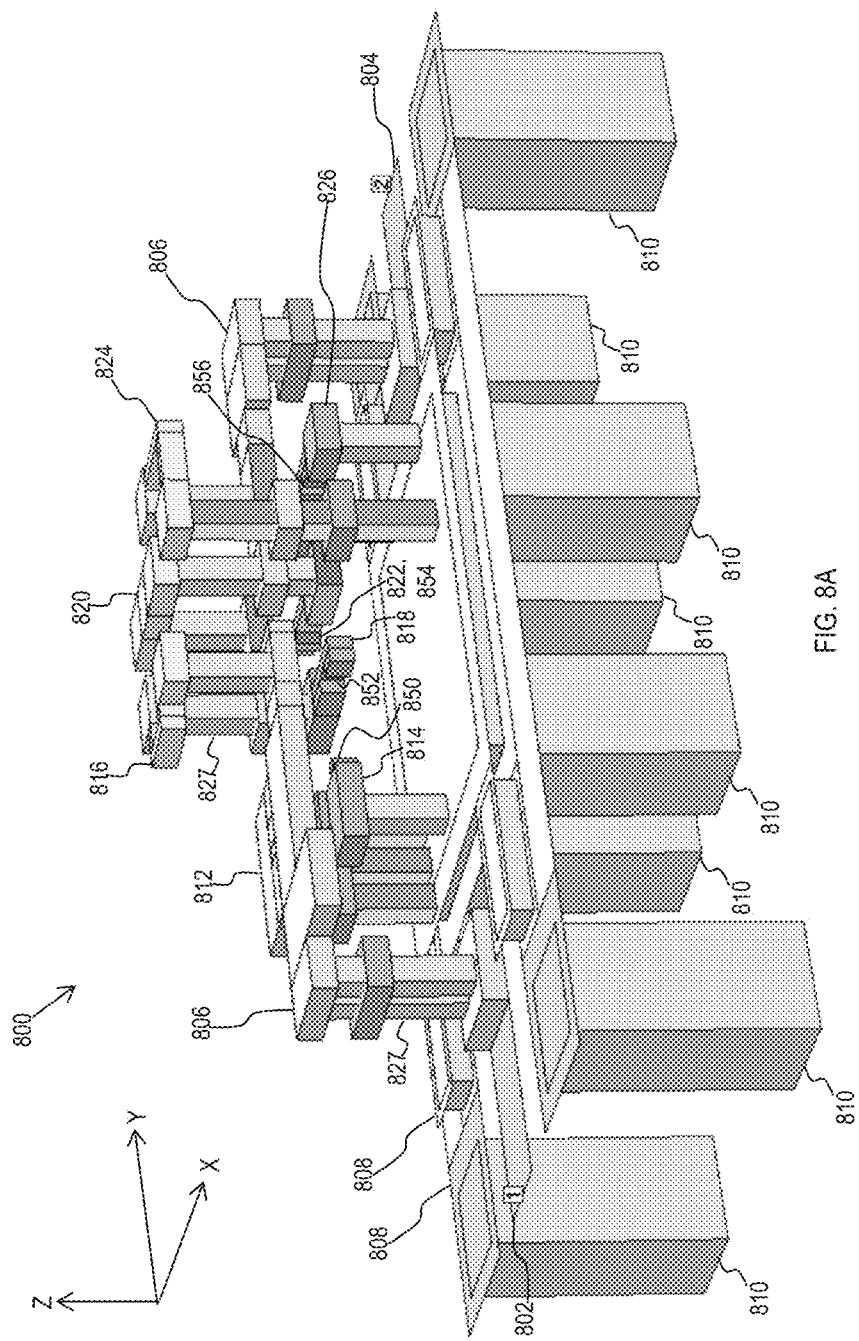
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5D. The filter 800 may include an input 802, an output 804, and a signal path 806 connecting the input 802 and the output 804. The filter 800 may also include a ground plane 808 electrically connected with one or more ground electrodes 810.

The filter 800 may include a first inductor 812 that is electrically connected with the ground plane 808. The first inductor 812 may correspond with the first inductor 208 of the circuit diagram 200 described above with reference to FIG. 2. The filter 800 may include a first capacitor 814 electrically coupled with the ground plane 808. The first capacitor 814 may correspond with the first inductor capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. Lastly, the filter 800 may include a fourth inductor 824 and fourth capacitor 826 that are connected in parallel with each other and connected between the signal path 806 and the ground plane 808. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias 827 in a similar manner as described above with reference to FIGS. 3 through 5D. Each of the inductors 812, 818, 820, 824 may be connected with the signal path 806 at a respective first location and connected with the signal path 806 or the ground plane 808 at a respective second location. Each of the inductors 812, 818, 820, 824 may have a respective effective length (e.g., in the X-Y plane) between the first location and the second location. Additionally, each of the inductors 812, 818, 820, 824 may have a respective width along its respective effective length.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed on the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed on a top surface of the third dielectric layer 840.

FIGS. 9A through 9D are a series of sequential top down views of the filter 600 of FIGS. 8A and 8B in which an additional dielectric layer is shown in each Figure. More specifically, FIG. 9A illustrates a mounting surface 828, such as a printed circuit board. The first conductive layers 830 may include the ground plane 808, which may be formed on a bottom surface and a top surface of the first layer 832. FIG. 9B additionally illustrates the second conductive layer 834 formed on the first dielectric layer 832. The second conductive layer 834 may include the first capacitor 814, second capacitor 818, third capacitor 822 and forth capacitor 826. FIG. 9C additionally illustrates the third conductive layer 838 that is formed on the second dielectric layer 836. The third conductive layer 838 may include portions of the signal path 806 and the first inductor 812. FIG. 9D illustrates the fourth conductive layer 842 formed on the fourth dielectric layer 840. The fourth conductive layer 842 may include the second inductor 816, third inductor 822, and fourth inductor 824. The dielectric layers 832, 836, 840 are transparent to show the relative relocations of the various patterned conductive layers 830, 834, 838, 842.

Figure 10A:
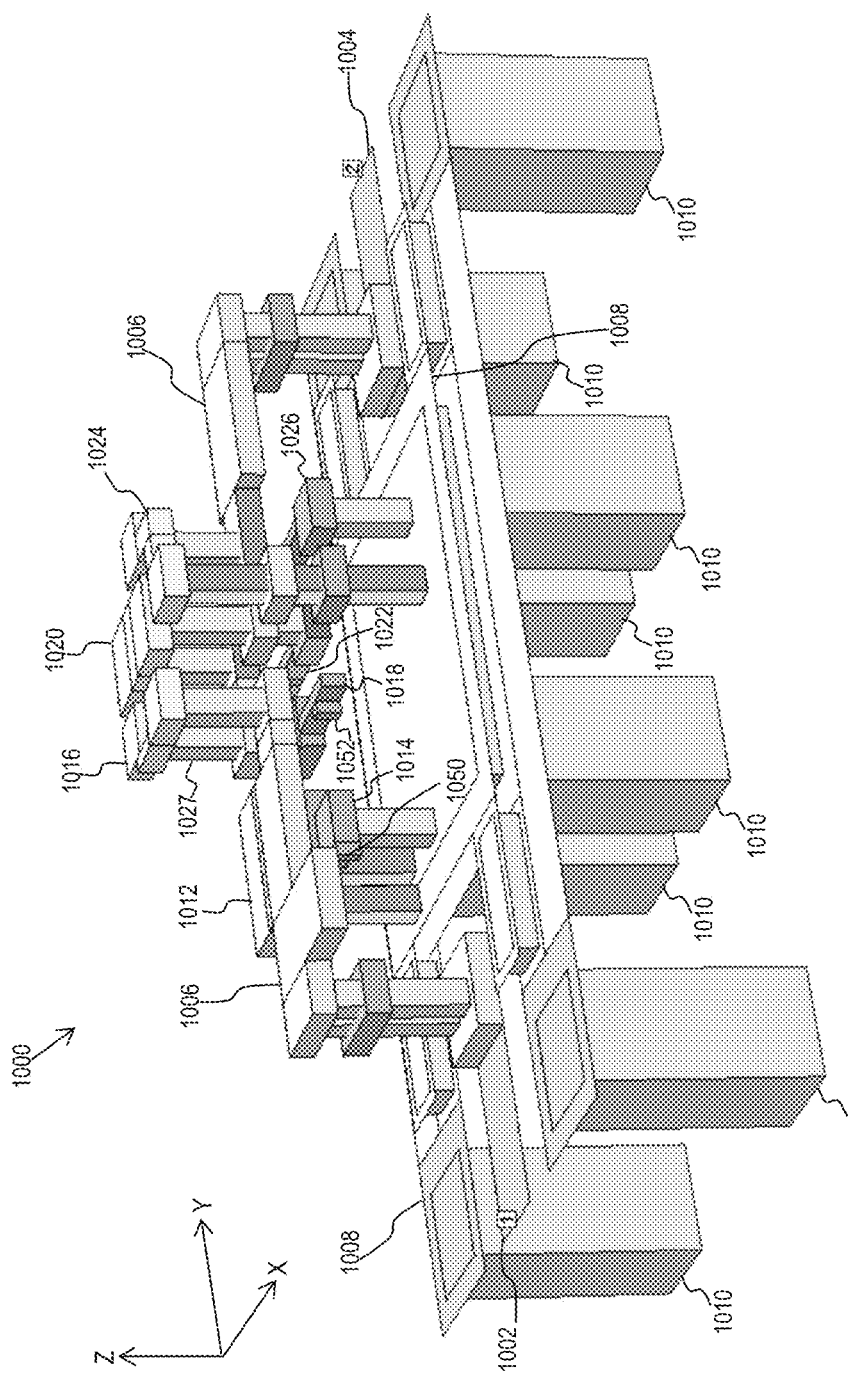
FIG. 10A is a perspective view of another embodiment of a multilayer filter according to aspects of the present disclosure.
Figure 10B:
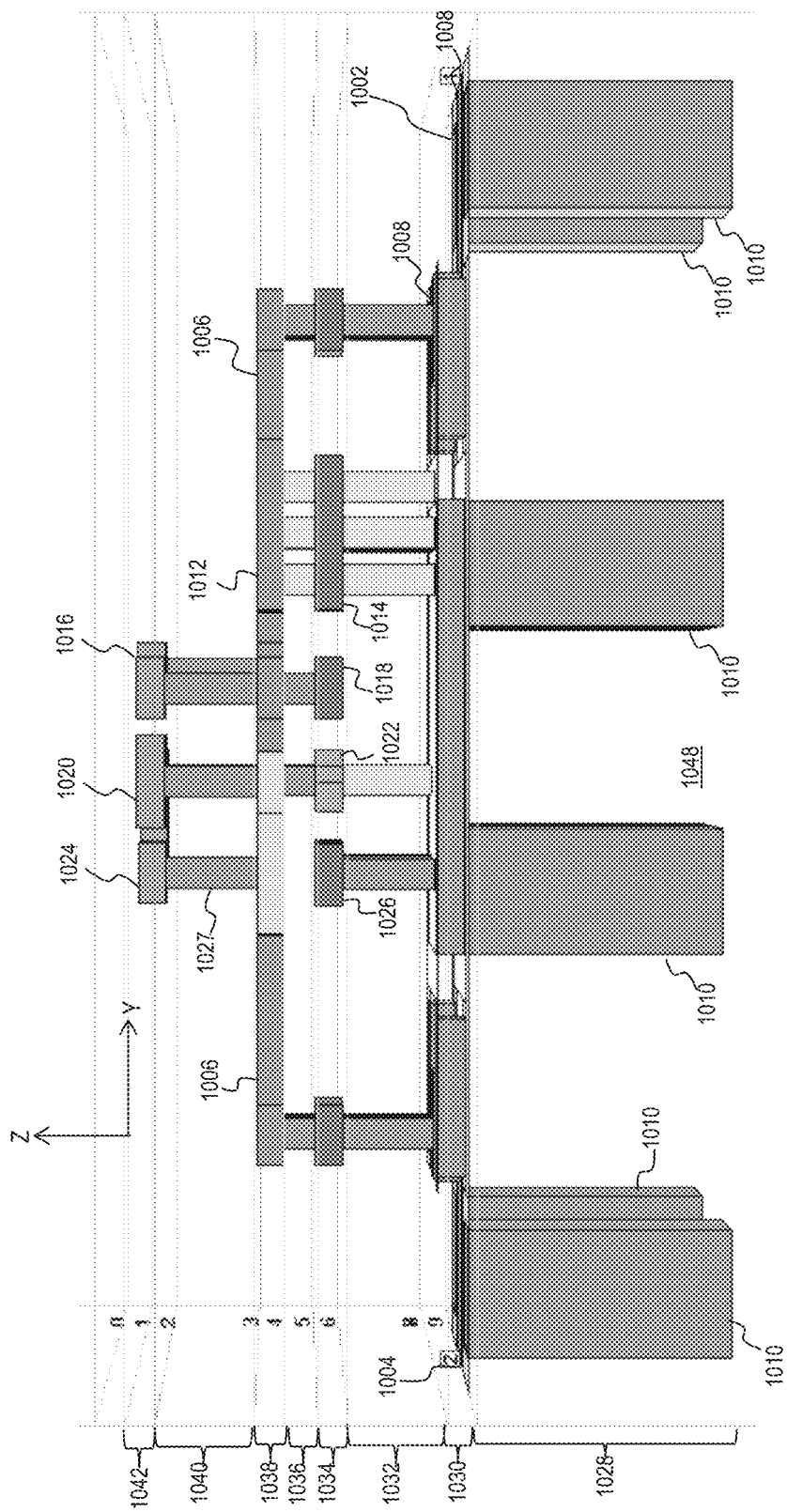
FIG. 10B is a side elevation view of the filter of FIG. 10A.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5D. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008. The first capacitor 1014 may correspond with the first inductor capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. Lastly, the filter 1000 may include a fourth inductor 1024 and fourth capacitor 1026 that are connected in parallel with each other and connected between the signal path 1006 and the ground plane 1008. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias 1027 in a similar manner as described above with reference to FIGS. 3 through 5D. Each of the inductors 1012, 10110, 1020, 1024 may be connected with the signal path 1006 at a respective first location and connected with the signal path 1006 or the ground plane 1008 at a respective second location. Each of the inductors 1012, 10110, 1020, 1024 may have a respective effective length (e.g., in the X-Y plane) between the first location and the second location. Additionally, each of the inductors 1012, 10110, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed on the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed on a top surface of the third dielectric layer 1040.

FIGS. 11A through 11D are a series of sequential top down views of the filter 600 of FIGS. 10A and 10B in which an additional dielectric layer is shown in each Figure. More specifically, FIG. 11A illustrates a mounting surface 1028, such a printed circuit board. The first conductive layer 1030 may include the ground plane 1008, which may be formed on a bottom surface and a top surface of the first layer 1030. FIG. 11B additionally illustrates the second conductive layer 1034 formed on the first dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed on the second dielectric layer 1036. The third conductive layer 1038 may include portions of the signal path 1006 and the first inductor 1012. FIG. 11D illustrates the fourth conductive layer 1042 formed on the fourth dielectric layer 1040. The fourth conductive layer 1042 may include the second inductor 1016, third inductor 1022, and fourth inductor 1024. The dielectric layers 1032, 1036, 1040 are transparent to show the relative relocations of the various patterned conductive layers 1030, 1034, 1038, 1042.

IV. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

EXAMPLES

Computer modeling was used to simulate multilayer high frequency filters according to aspects of the present disclosure. Additionally, filters were built and tested. It should be understood that the following dimensions are merely given as examples and do not limit the scope of the present disclosure.

The capacitors of the multilayer filter 300 described above with reference to FIGS. 3A through 4E may be dimensioned to have the following areas and ratio:

TABLE 1

Example Areas and Ratios for Multilayer Filter 300

|  | First Capacitor | Second Capacitor | Third Capacitor | Fourth Capacitor |
| --- | --- | --- | --- | --- |
| Total Overlapping Area (mm$^2$) | 0.153 | 0.0575 | 0.0275 | 0.0625 |
| Area of Protrusion (mm$^2$) | 0.0275 | 0.0125 | 0.0025 | 0.010 |
| Overlapping-Area-To-Feature-Area Ratio | 5 | 4.6 | 11 | 6.25 |

The capacitors of the multilayer filter 600 described above with reference to FIGS. 6A through 7E may be dimensioned to have the following areas and ratio:

TABLE 2

Example Areas and Ratios for Multilayer Filter 600

|  | First Capacitor | Second Capacitor | Third Capacitor | Fourth Capacitor |
| --- | --- | --- | --- | --- |
| Total Overlapping Area (mm$^2$) | 0.083 | 0.0375 | 0.020 | 0.0375 |
| Area of Protrusion (mm$^2$) | 0.0026 | — | — | — |

TABLE 2-continued

Example Areas and Ratios for Multilayer Filter 600

| | First Capacitor | Second Capacitor | Third Capacitor | Fourth Capacitor |
|---|---|---|---|---|
| Area of Recess (mm$^2$) | — | 0.0026 | — | 0.0026 |
| Overlapping-Area-To-Feature-Area Ratio | 32 | 42 | — | 15 |

The capacitors of the multilayer filter 800 described above with reference to FIGS. 8A through 9E may be dimensioned to have the following areas and ratio:

TABLE 3

Example Areas and Ratios for Multilayer Filter 800

| | First Capacitor | Second Capacitor | Third Capacitor | Fourth Capacitor |
|---|---|---|---|---|
| Total Overlapping Area (mm$^2$) | 0.065 | 0.015 | 0.013 | 0.018 |
| Area of Protrusion (mm$^2$) | 0.0026 | — | 0.0026 | — |
| Area of Recess (mm$^2$) | — | 0.0052 | — | 0.0026 |
| Overlapping-Area-To-Feature-Area Ratio | 25 | 3 | 5 | 7 |

The capacitors of the multilayer filter 1000 described above with reference to FIGS. 10A through 11E may be dimensioned to have the following areas and ratio:

TABLE 4

Example Areas and Ratios for Multilayer Filter 1000

| | First Capacitor | Second Capacitor | Third Capacitor | Fourth Capacitor |
|---|---|---|---|---|
| Total Overlapping Area (mm$^2$) | 0.044 | 0.013 | 0.010 | 0.010 |
| Area of Protrusion (mm$^2$) | 0.0026 | — | — | — |
| Area of Recess (mm$^2$) | — | 0.0026 | — | — |
| Overlapping-Area-To-Feature-Area Ratio | 17 | 5 | — | — |

The thicknesses of the dielectric layers may generally be less than about 180 micrometers ("microns"). For instance, in some embodiments, the first layers 304, 632, 832, 1032 may be about 60 microns thick. The second layers 304, 636, 836, 1036 may be about 20 microns thick. Thus, in these examples, the respective layers of the first through fourth capacitors are spaced apart in the Z-direction from each other by 20 microns. The third layers 308, 640, 840, 1040 may be about 60 microns thick.

The overall length of the filters 300, 600, 800, 1000 were 4.3 mm, and the overall widths were about 4 mm. The overall thicknesses were 230 microns.

Figure 12:
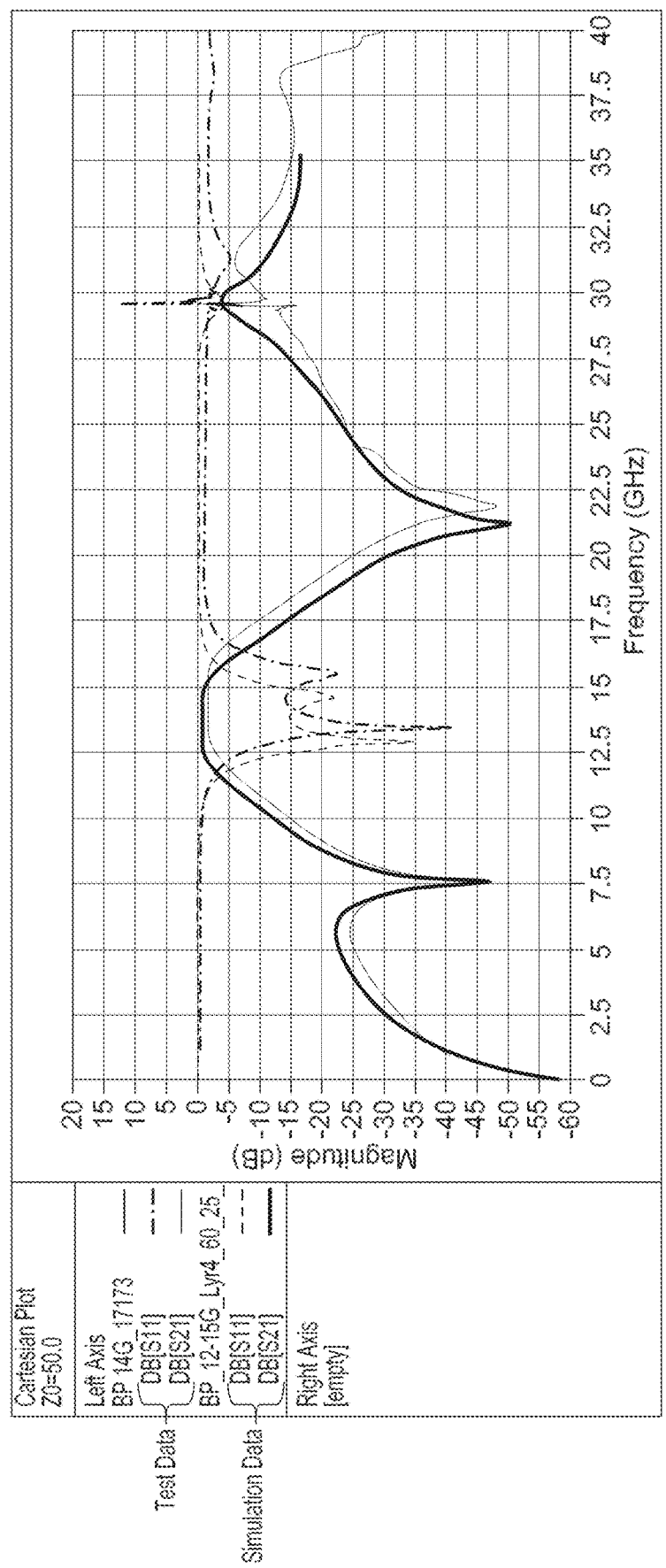
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
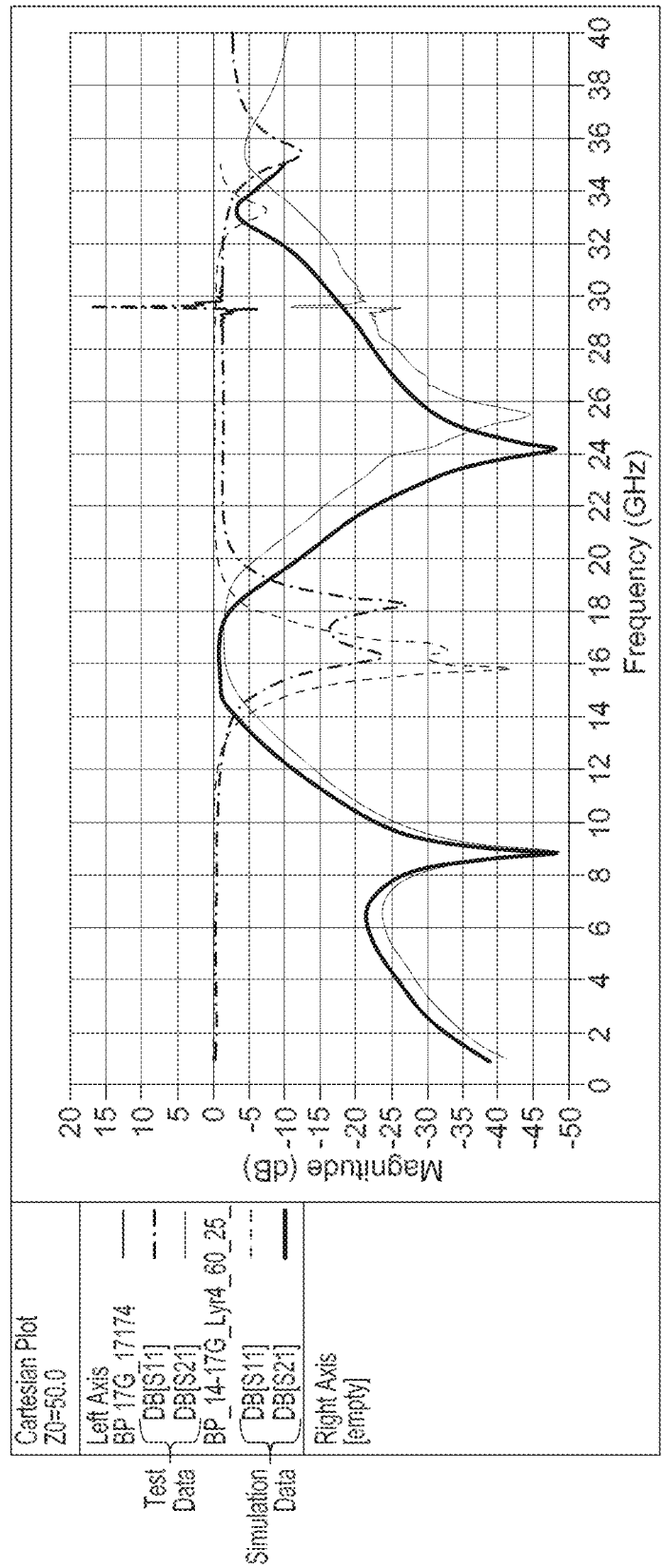
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
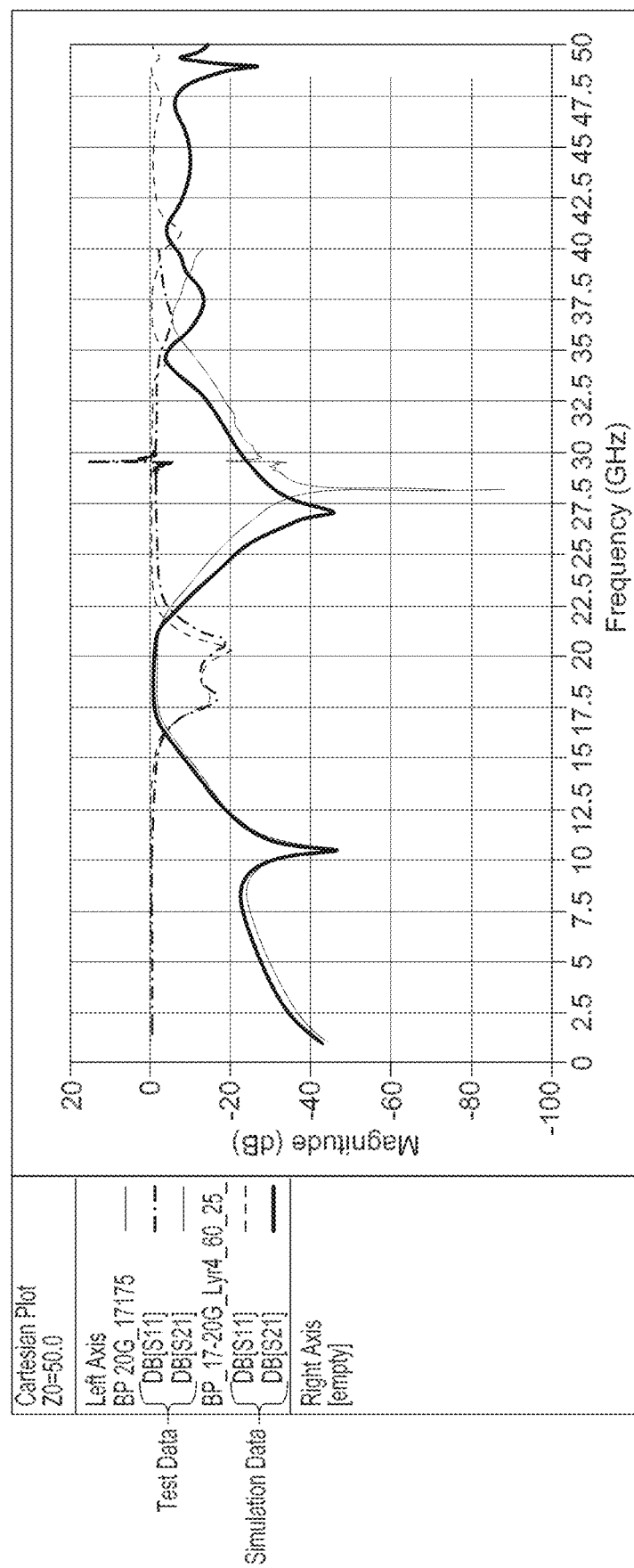
FIG. 14 is a plot of test data including measured insertion loss and return loss values for a filter constructed according to aspects of the present disclosure.

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Figure 15:
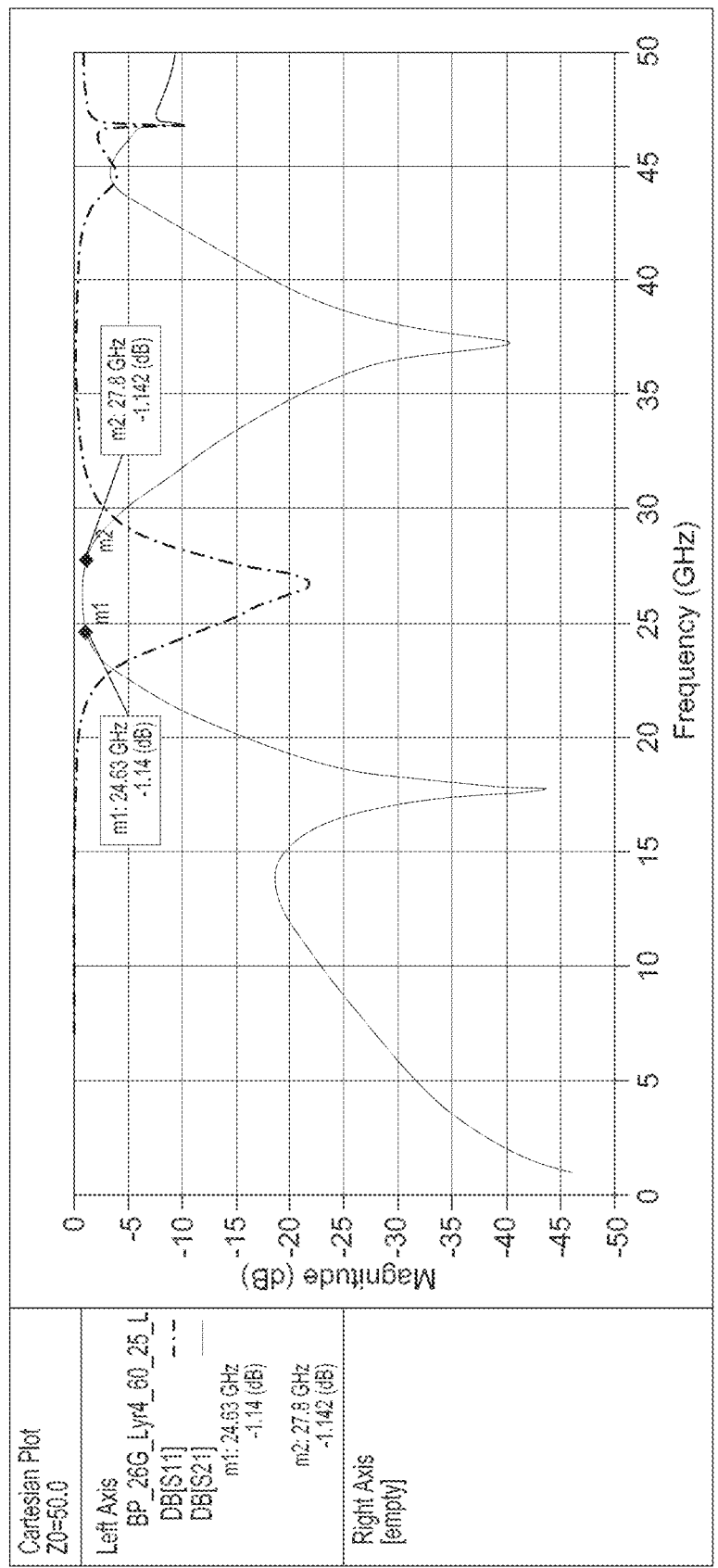
FIG. 15 is a plot of simulation data including insertion loss and return loss values from a computer analysis of a filter according to aspects of the present disclosure.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16:
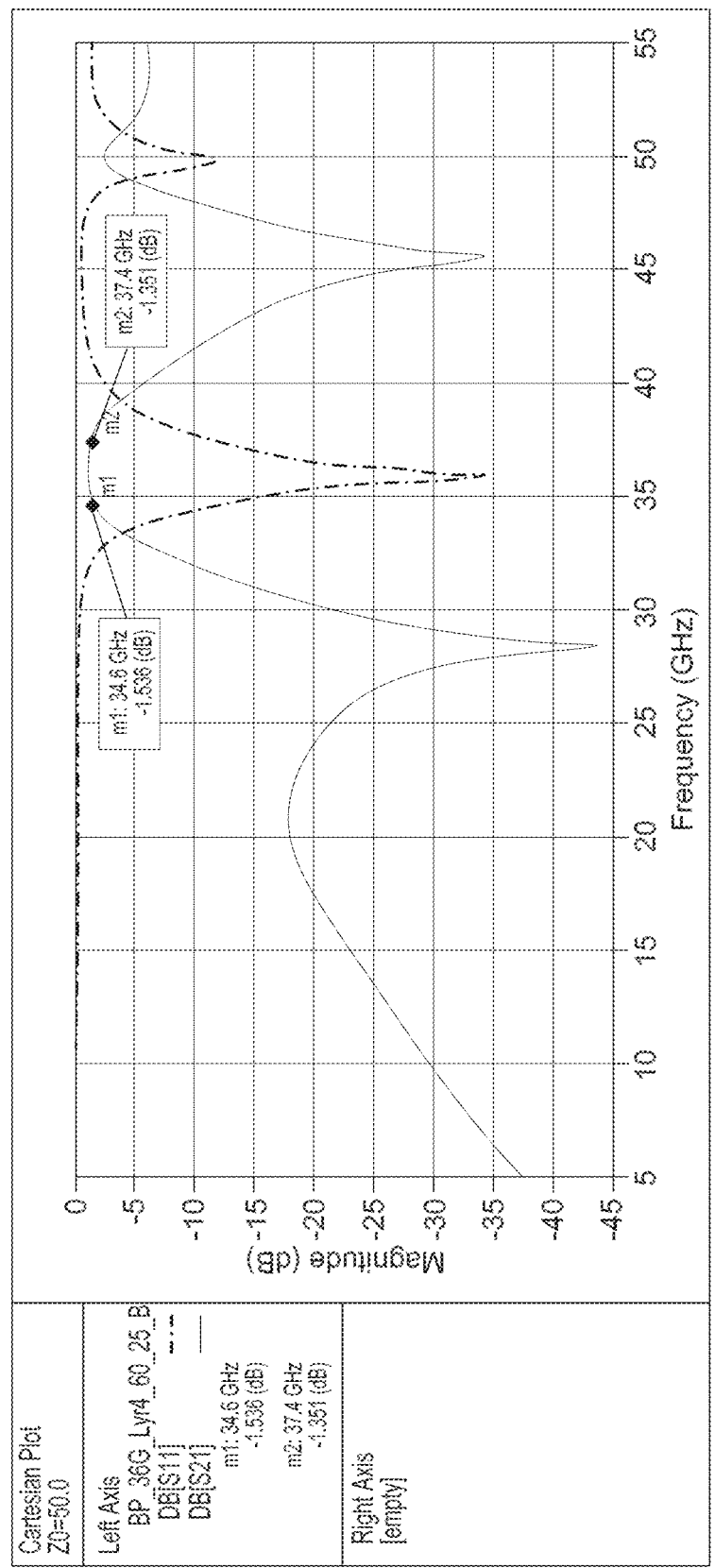
FIG. 16 is a plot of simulation data including insertion loss and return loss values from a computer analysis of a filter according to aspects of the present disclosure.

Referring to FIG. 16, the multilayer filter 800 described above with reference to FIGS. 8A through 9D was simulated. Simulated insertion loss ($S_{21}$) values and simulated return loss ($S_{11}$) values are plotted from 0 GHz to 55 GHz. The pass band is from about 34.6 GHz to about 37.4 GHz.

Figure 17:
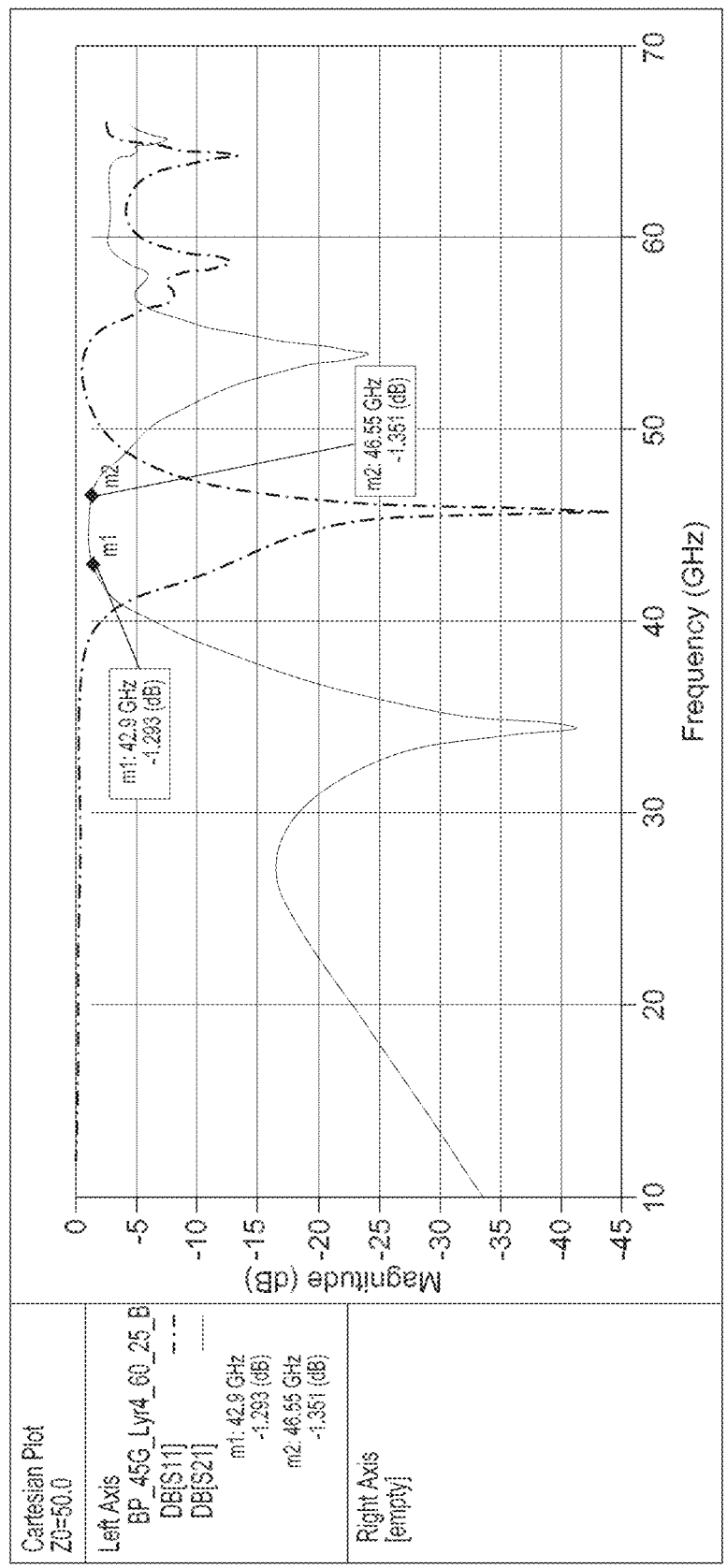
FIG. 17 is a plot of simulation data including insertion loss and return loss values from a computer analysis of a filter according to aspects of the present disclosure.

Referring to FIG. 17, the multilayer filter 1000 described above with reference to FIGS. 10A through 11D was simulated. Simulated insertion loss ($S_{21}$) values and simulated return loss ($S_{11}$) values are plotted from 0 GHz to 70 GHz. The pass band is from about 42.9 GHz to about 46.6 GHz.

Test Methods

Figure 18:
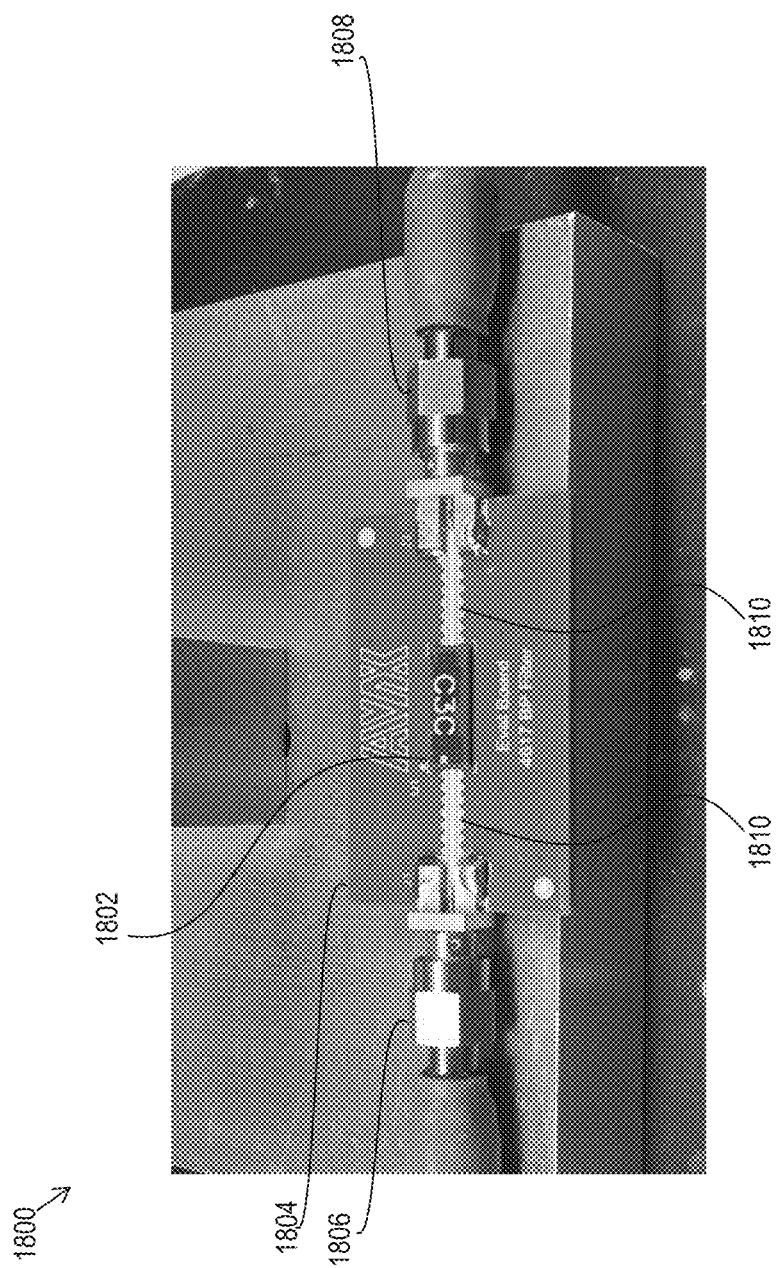
FIG. 18 is a perspective view of a testing assembly including a filter according to aspects of the present disclosure.

Referring to FIG. 18, a testing assembly 1800 can be used to test performance characteristics, such as insertion loss and return loss, of a multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., a 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multilayer electronic device comprising:
a plurality of dielectric layers stacked in a Z-direction that is perpendicular to an X-Y plane;
a first conductive layer overlying one of the plurality of dielectric layers; and
a second conductive layer overlying another of the plurality of dielectric layers and spaced apart from the first conductive layer in the Z-direction, wherein the second conductive layer overlaps the first conductive layer in the X-Y plane at an overlapping area to form a capacitor,
wherein the first conductive layer has a pair of parallel edges at a boundary of the overlapping area, wherein the first conductive layer has an offset edge within the overlapping area that is parallel with the pair of parallel edges, and wherein the offset edge is offset from at least one of the pair of parallel edges by an offset distance that is less than about 500 microns, and
wherein the capacitor has an overlapping-area-to-feature-area ratio that is greater than about 2.

2. The multilayer electronic device of claim 1, wherein the first conductive layer has a first width between the pair of parallel edges and a second width at the offset edge in a direction perpendicular to the offset edge, and wherein the second width is greater than the first width.

3. The multilayer electronic device of claim 1, wherein the first conductive layer has a first width between the pair of parallel edges and a second width at the offset edge in a direction perpendicular to the offset edge, and wherein the second width is less than the first width.

4. The multilayer electronic device of claim 1, wherein a width discontinuity edge extends between the offset edge and the at least one of the pair of parallel edges.

5. The multilayer electronic device of claim 4, wherein the width discontinuity edge is located at least about 30 microns from the boundary of the overlapping area.

6. The multilayer electronic device of claim 1, wherein the first conductive layer includes a protrusion that extends outside of the pair of parallel edges and inside the overlapping area.

7. The multilayer electronic device of claim 6, wherein the protrusion has an area in the X-Y plane that is less than about 0.2 mm².

8. The multilayer electronic device of claim 1, wherein the first conductive layer includes a recess inside the overlapping area.

9. The multilayer electronic device of claim 8, wherein the recess has an area in the X-Y plane that is less than about 0.2 mm².

10. The multilayer electronic device of claim 1, wherein the offset edge has a length in a direction parallel with the pair of parallel edges that is less than about 500 microns.

11. The multilayer electronic device of claim 1, wherein the capacitor has an overlapping area that is less than about 0.5 mm².

12. The multilayer electronic device of claim 1, further comprising a dielectric material that comprises an epoxy.

13. The multilayer electronic device of claim 1, wherein the first conductive layer and the second conductive layer are spaced apart in the Z-direction by less than about 100 microns.

14. The multilayer electronic device of claim 1, wherein the capacitor is self-aligning.

15. The multilayer electronic device of claim 1, further comprising a dielectric material disposed between the first conductive layer and the second conductive layer, the dielectric material having a dielectric constant that ranges from about 5 to about 8 in accordance with IPC TM-650 2.5.5.3 at an operating temperature of 25° C. and frequency of 1 MHz.

16. The multilayer electronic device of claim 15, further comprising an additional dielectric material having a dielectric constant that ranges from about 1 to about 4 in accordance with IPC TM-650 2.5.5.3 at an operating temperature of 25° C. and frequency of 1 MHz.

17. The multilayer electronic device of claim 1, wherein the multilayer electronic device is configured as a filter.

18. The multilayer electronic device of claim 17, wherein the filter has a characteristic frequency that is greater than about 6 GHz.

19. The multilayer electronic device of claim 18, wherein the characteristic frequency comprises at least one of a low pass frequency, a high pass frequency, or an upper bound of a bandpass frequency.

20. The multilayer electronic device of claim 1, further comprising a ground plane and a via electrically connecting at least one of the first conductive layer or the second conductive layer to the ground plane.

21. The multilayer electronic device of claim 1, further comprising a dielectric material having a dielectric constant that is less than about 100 as determined in accordance with IPC TM-650 2.5.5.3 at an operating temperature of 25° C. and frequency of 1 MHz.

22. The multilayer electronic device of claim 1, further comprising a dielectric material having a dielectric constant that is greater than about 100 as determined in accordance with IPC TM-650 2.5.5.3 at an operating temperature of 25° C. and frequency of 1 MHz.

23. The multilayer electronic device of claim 1, further comprising an organic dielectric material.

24. The multilayer electronic device of claim 23, wherein the organic dielectric material comprises at least one of liquid crystalline polymer or polyphenyl ether.

25. A multilayer electronic device comprising:
a plurality of dielectric layers stacked in a Z-direction that is perpendicular to an X-Y plane;
a first conductive layer overlying one of the plurality of dielectric layers;
a second conductive layer overlying another of the plurality of dielectric layers and spaced apart from the first conductive layer in the Z-direction, wherein the second conductive layer overlaps the first conductive layer in the X-Y plane at an overlapping area to form a capacitor, wherein the first conductive layer has a pair of parallel edges at a boundary of the overlapping area, and wherein the first conductive layer has an offset edge within the overlapping area that is parallel with the pair of parallel edges;
a dielectric material disposed between the first conductive layer and the second conductive layer, the dielectric material having a dielectric constant that ranges from about 5 to about 8 in accordance with IPC TM-650 2.5.5.3 at an operating temperature of 25° C. and frequency of 1 MHz; and
an additional dielectric material having a dielectric constant that ranges from about 1 to about 4 in accordance with IPC TM-650 2.5.5.3 at an operating temperature of 25° C. and frequency of 1 MHz.

26. A multilayer electronic device comprising:
a plurality of dielectric layers stacked in a Z-direction that is perpendicular to an X-Y plane;
a first conductive layer overlying one of the plurality of dielectric layers;
a second conductive layer overlying another of the plurality of dielectric layers and spaced apart from the first conductive layer in the Z-direction, wherein the second conductive layer overlaps the first conductive layer in the X-Y plane at an overlapping area to form a capacitor, wherein the first conductive layer has a pair of parallel edges at a boundary of the overlapping area, and wherein the first conductive layer has an offset edge within the overlapping area that is parallel with the pair of parallel edges;
a ground plane; and
a via electrically connecting at least one of the first conductive layer or the second conductive layer to the ground plane.

27. A method of designing a capacitor of a multilayer electronic device, the method comprising:
calculating a target overlapping area;
selecting dimensions of an overlapping area based on the target overlapping area; and
sizing an offset distance between an offset edge and at least one of a pair of parallel edges of a conductive layer to adjust a size of the overlapping area and reduce a difference between the size of the overlapping area and a size of the target overlapping area, wherein the pair of parallel edges of the conductive layer are located at a boundary of the overlapping area, wherein the offset edge is located within the overlapping area, and wherein the capacitor has an overlapping-area-to-feature-area ratio that is greater than about 2.

28. A multilayer electronic device comprising:
a plurality of dielectric layers stacked in a Z-direction that is perpendicular to an X-Y plane;
a first conductive layer overlying one of the plurality of dielectric layers; and
a second conductive layer overlying another of the plurality of dielectric layers and spaced apart from the first conductive layer in the Z-direction, wherein the second conductive layer overlaps the first conductive layer in the X-Y plane at an overlapping area to form a capacitor,
wherein the first conductive layer has a pair of parallel edges at a boundary of the overlapping area, wherein the first conductive layer has an offset edge within the overlapping area that is parallel with the pair of parallel edges, wherein the first conductive layer has a first width between the pair of parallel edges and a second width at the offset edge in a direction perpendicular to the offset edge, and wherein the second width is greater than the first width.

29. A multilayer electronic device comprising:
a plurality of dielectric layers stacked in a Z-direction that is perpendicular to an X-Y plane;
a first conductive layer overlying one of the plurality of dielectric layers; and
a second conductive layer overlying another of the plurality of dielectric layers and spaced apart from the first conductive layer in the Z-direction, wherein the second conductive layer overlaps the first conductive layer in the X-Y plane at an overlapping area to form a capacitor,
wherein the first conductive layer has a pair of parallel edges at a boundary of the overlapping area, wherein the first conductive layer has an offset edge within the overlapping area that is parallel with the pair of parallel edges, and
wherein a width discontinuity edge extends between the offset edge and the at least one of the pair of parallel edges, the width discontinuity edge located at least about 30 microns from the boundary of the overlapping area.

30. A multilayer electronic device comprising:
a plurality of dielectric layers stacked in a Z-direction that is perpendicular to an X-Y plane;
a first conductive layer overlying one of the plurality of dielectric layers; and
a second conductive layer overlying another of the plurality of dielectric layers and spaced apart from the first conductive layer in the Z-direction, wherein the second conductive layer overlaps the first conductive layer in the X-Y plane at an overlapping area to form a capacitor,
wherein the first conductive layer has a pair of parallel edges at a boundary of the overlapping area, wherein the first conductive layer has an offset edge within the overlapping area that is parallel with the pair of parallel edges, and
wherein the first conductive layer includes a protrusion that extends outside of the pair of parallel edges and inside the overlapping area, the protrusion having an area in the X-Y plane that is less than about 0.2 mm$^2$.

31. A multilayer electronic device comprising:
a plurality of dielectric layers stacked in a Z-direction that is perpendicular to an X-Y plane;
a first conductive layer overlying one of the plurality of dielectric layers; and
a second conductive layer overlying another of the plurality of dielectric layers and spaced apart from the first conductive layer in the Z-direction, wherein the second conductive layer overlaps the first conductive layer in the X-Y plane at an overlapping area to form a capacitor,
wherein the first conductive layer has a pair of parallel edges at a boundary of the overlapping area, wherein the first conductive layer has an offset edge within the overlapping area that is parallel with the pair of parallel edges, and
wherein the first conductive layer includes a recess inside the overlapping area.

* * * * *